United States Patent
Kim et al.

(10) Patent No.: US 10,177,144 B2
(45) Date of Patent: Jan. 8, 2019

(54) SEMICONDUCTOR DEVICE AND METHOD OF MANUFACTURING THE SEMICONDUCTOR DEVICE

(71) Applicant: Samsung Electronics Co., Ltd., Suwon-si, Gyeonggi-do (KR)

(72) Inventors: Ju-youn Kim, Suwon-si (KR); Sang-jung Kang, Daejeon (KR); Ji-hwan An, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/449,248

(22) Filed: Mar. 3, 2017

(65) Prior Publication Data
US 2017/0179124 A1 Jun. 22, 2017

Related U.S. Application Data

(62) Division of application No. 14/984,284, filed on Dec. 30, 2015, now Pat. No. 9,614,090.

(30) Foreign Application Priority Data

Mar. 17, 2015 (KR) .................. 10-2015-0036761

(51) Int. Cl.
*H01L 27/088* (2006.01)
*H01L 29/78* (2006.01)
*H01L 29/06* (2006.01)
*H01L 29/423* (2006.01)
*H01L 29/66* (2006.01)
*H01L 21/8234* (2006.01)

(52) U.S. Cl.
CPC .. *H01L 27/0886* (2013.01); *H01L 21/823431* (2013.01); *H01L 29/0649* (2013.01); *H01L 29/42376* (2013.01); *H01L 29/66545* (2013.01); *H01L 29/66795* (2013.01); *H01L 29/7856* (2013.01)

(58) Field of Classification Search
CPC ........... H01L 29/0649; H01L 29/42376; H01L 29/66545; H01L 29/66795; H01L 29/7856; H01L 21/823431; H01L 27/0886
USPC .......................................................... 257/401
See application file for complete search history.

(56) References Cited

U.S. PATENT DOCUMENTS

| 6,040,214 A | 3/2000 | Boyd et al. |
| 6,468,880 B1 | 10/2002 | Lim et al. |
| 6,849,497 B2 | 2/2005 | Hashimoto |

(Continued)

FOREIGN PATENT DOCUMENTS

| KR | 2003-0075745 A | 9/2003 |
| KR | 2004-0026240 A | 3/2004 |

(Continued)

*Primary Examiner* — Long K Tran
(74) *Attorney, Agent, or Firm* — Harness, Dickey & Pierce, P.L.C.

(57) ABSTRACT

A semiconductor device includes at least one first gate structure and at least one second gate structure on a semiconductor substrate. The at least one first gate structure has a flat upper surface extending in a first direction and a first width in a second direction perpendicular to the first direction. The at least one second gate structure has a convex upper surface extending in the first direction and a second width in the second direction, the second width being greater than the first width.

35 Claims, 25 Drawing Sheets

(56) References Cited

U.S. PATENT DOCUMENTS

| | | |
|---|---|---|
| 6,855,604 B2 | 2/2005 | Lee |
| 7,871,915 B2 | 1/2011 | Lim et al. |
| 7,923,321 B2 | 4/2011 | Lai et al. |
| 7,939,392 B2 | 5/2011 | Chung et al. |
| 7,977,181 B2 | 7/2011 | Lai et al. |
| 7,981,801 B2 | 7/2011 | Chuang et al. |
| 7,986,012 B2 | 7/2011 | Matsubara et al. |
| 8,039,381 B2 | 10/2011 | Yeh et al. |
| 8,058,119 B2 | 11/2011 | Chung et al. |
| 8,093,116 B2 | 1/2012 | Chung et al. |
| 8,093,120 B2 | 1/2012 | Yeh et al. |
| 8,125,051 B2 | 2/2012 | Chuang et al. |
| 8,153,526 B2 | 4/2012 | Lee et al. |
| 8,222,132 B2 | 7/2012 | Lee et al. |
| 8,252,689 B2 | 8/2012 | Yang et al. |
| 8,390,072 B2 | 3/2013 | Chuang et al. |
| 8,409,986 B2 | 4/2013 | Yang et al. |
| 8,440,533 B2 | 5/2013 | Toh et al. |
| 8,476,126 B2 | 7/2013 | Chuang et al. |
| 8,487,382 B2 | 7/2013 | Chung et al. |
| 8,530,326 B2 | 9/2013 | Lai et al. |
| 8,535,998 B2 | 9/2013 | Hing et al. |
| 8,609,484 B2 | 12/2013 | Tao et al. |
| 8,697,517 B2 | 4/2014 | Chuang et al. |
| 8,722,523 B2 | 5/2014 | Schloesser et al. |
| 8,853,088 B2 | 10/2014 | Kim et al. |
| 2002/0197805 A1 | 12/2002 | Kwon et al. |
| 2008/0054356 A1 | 3/2008 | Yoshida |
| 2013/0005133 A1 | 1/2013 | Lee et al. |
| 2014/0183652 A1 | 7/2014 | Chern et al. |
| 2014/0227869 A1* | 8/2014 | Reimer ............... H01L 29/401 438/595 |
| 2015/0206974 A1* | 7/2015 | Lim ............... H01L 29/7851 257/288 |
| 2016/0104704 A1* | 4/2016 | Fang ............... H01L 29/4966 257/392 |
| 2016/0190271 A1* | 6/2016 | You ............... H01L 29/42376 257/401 |

FOREIGN PATENT DOCUMENTS

| | | |
|---|---|---|
| KR | 10-0464271 B1 | 1/2005 |
| KR | 2008-0010996 A | 1/2008 |

* cited by examiner

SEMICONDUCTOR DEVICE AND METHOD OF MANUFACTURING THE SEMICONDUCTOR DEVICE

CROSS-REFERENCE TO RELATED APPLICATION

This application is a divisional of U.S. application Ser. No. 14/984,284, filed on Dec. 30, 2015, which claims the benefit of Korean Patent Application No. 10-2015-0036761, filed on Mar. 17, 2015, in the Korean Intellectual Property Office, the entire contents of each of which are incorporated herein by reference.

BACKGROUND

1. Field

Example embodiments of the inventive concepts relate to a semiconductor device, and more particularly, to a semiconductor device including a gate structure and a method of manufacturing the semiconductor device.

2. Description of the Related Art

A metal oxide semiconductor (MOS) transistor using polysilicon is widely known as an example of a gate electrode. Polysilicon is more durable than most metals at a relatively high temperature so that polysilicon along with source and drain regions may be annealed at the relatively high temperature. Polysilicon may be used to form a self-aligned source and drain structure after gate patterning is complete. However, because polysilicon has relatively high resistance compared to most metal materials, a polysilicon gate electrode has a lower operating speed than a metal gate electrode. As a method of compensating for the relatively high resistance of polysilicon, a method of replacing the polysilicon gate electrode with the metal gate electrode may be used. Such a method may be performed using a replacement metal gate (RMG) process. While polysilicon exists on a semiconductor substrate, a relatively high temperature process may be performed, and then, a metal gate may be formed by removing the polysilicon and replacing it with metal.

SUMMARY

Example embodiments of the inventive concepts provide a semiconductor device having improved operating performance and a method of manufacturing the semiconductor device.

According to example embodiments of the inventive concepts, a semiconductor device includes at least one first gate structure on a semiconductor substrate, the at least one first gate structure having a flat upper surface extending in a first direction and having a first width in a second direction perpendicular to the first direction, and at least one second gate structure on the semiconductor substrate, the at least one second gate structure having a convex upper surface extending in the first direction and having a second width in the second direction , the second width being greater than the first width.

According to example embodiments of the inventive concepts, a semiconductor device includes a semiconductor substrate defining a first region and a second region, at least first and second fins protruding from the semiconductor substrate, the at least first and second fins extending in a first direction, at least one first gate structure on the first region of the semiconductor substrate and covering upper and side surfaces of the first fin, the at least one first gate structure having a flat upper surface extending in a second direction perpendicular to the first direction and having a first width in the first direction, and at least one second gate structure on the second region of the semiconductor substrate and covering upper and side surfaces of the second fin, the at least one second gate structure having a convex upper surface extending in the second direction perpendicular to the first direction and having a second width greater than the first width in the first direction.

According to example embodiments of the inventive concepts, a method of manufacturing a semiconductor device includes forming a plurality of dummy gate structures extending in a first direction on a semiconductor substrate, each of the plurality of dummy gate structures including a dummy gate insulating film and a dummy gate electrode, forming spacers on side walls of the plurality of dummy gate structures, forming an interlayer insulating film covering the semiconductor substrate, planarizing the interlayer insulating film such that upper surfaces of the plurality of dummy gate structures are exposed, removing the plurality of dummy gate structures, forming a first insulating film and a metal film on the interlayer insulating film and on a portion of the semiconductor substrate where the plurality of dummy gate structures are removed, and forming a plurality of gate structures by planarizing the first insulating film and the metal film such that an upper surface of the interlayer insulating film is exposed, each of the plurality of gate structures including a gate insulating film and a metal gate electrode, the plurality of gate structures including at least one first gate structure having a flat upper surface, the at least one first gate structure having a first width in a second direction perpendicular to the first direction, and at least one second gate structure having a convex upper surface, the at least one second gate structure having a second width greater than the first width in the second direction.

According to example embodiments of the inventive concepts, a method of manufacturing a semiconductor device includes etching a portion of a semiconductor substrate to form trenches, forming a protrusion structure protruding from the semiconductor substrate between the trenches, the protrusion structure extending in a first direction, forming a device isolation film by filling a portion of the trenches with insulating materials, forming at least one fin corresponding to an upper portion of the protrusion structure, the at least one fin protruding from the device isolation film, and forming a plurality of gate structures covering a portion of the semiconductor substrate, the device isolation film, and the at least one fin, the plurality of gate structures extending in a second direction perpendicular to the first direction and each of the plurality of gate structures including a gate insulating film and a metal gate electrode, the plurality of gate structures including at least one first gate structure having a flat upper surface, the at least one first gate structure having a first width in the first direction, and at least one second gate structure having a convex upper surface, the at least one second gate structure having a second width greater than the first width in the first direction.

According to example embodiments of the inventive concepts, a semiconductor device includes a semiconductor substrate including a first region and a second region, and at least two gate structures on the semiconductor substrate, the at least two gate structures including at least one first gate structure in the first region, the at least one first gate structure having a flat upper surface extending in a first direction and having a first width in a second direction perpendicular to the first direction, and a second gate structure in the second region, the second gate structure having a convex upper surface extending in the first direction and having a second width in the second direction, the second width being greater by at least two times than the first width.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
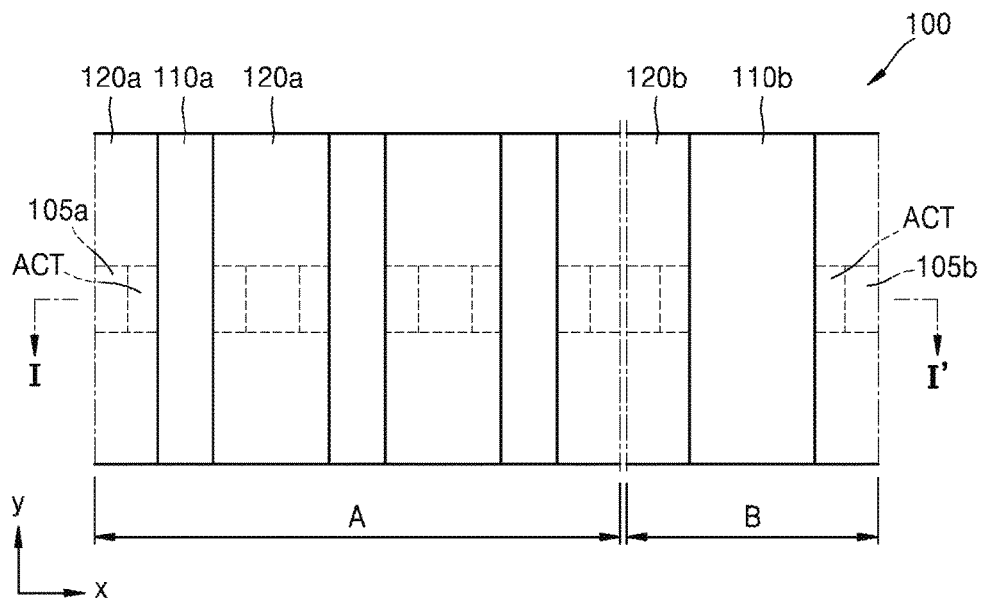
FIG. 1 is a schematic plan view illustrating a semiconductor device, according to example embodiments.

The inventive concepts now will be described more fully hereinafter with reference to the accompanying drawings, in which elements of the inventive concepts are shown.

The inventive concepts may, however, be embodied in many different forms and should not be construed as limited to the example embodiments set forth herein. Rather, these embodiments are provided so that this disclosure will be thorough and complete, and will fully convey the scope of the inventive concepts to one of ordinary skill in the art.

It will be understood that when an element is referred to as being "on" another element, it can be directly on the other element, or intervening elements may also be present therebetween. Likewise, it will be understood that when an element is referred to as being "connected" to another element, it may be "directly connected" to the other element or intervening elements may be present therebetween. Structures or sizes of elements in the drawings are exaggerated for convenience of description and clarity and parts in the drawings unrelated to the detailed description are omitted. Like reference numerals refer to like elements throughout. The terminology used herein is for the purpose of describing example embodiments only and is not intended to be limiting of example embodiments. As used herein, the term "and/or" includes any and all combinations of one or more of the associated listed items. Expressions such as "at least one of," when preceding a list of elements, modify the entire list of elements and do not modify the individual elements of the list.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
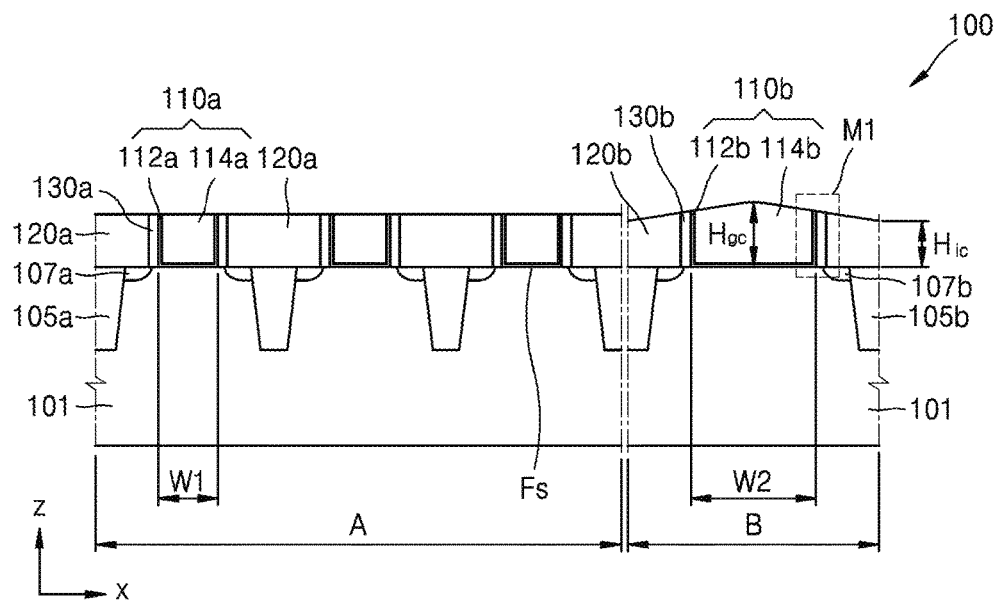
FIG. 2 is a cross-sectional view taken along a line I-I' of the semiconductor device of FIG. 1.
Figure 3:
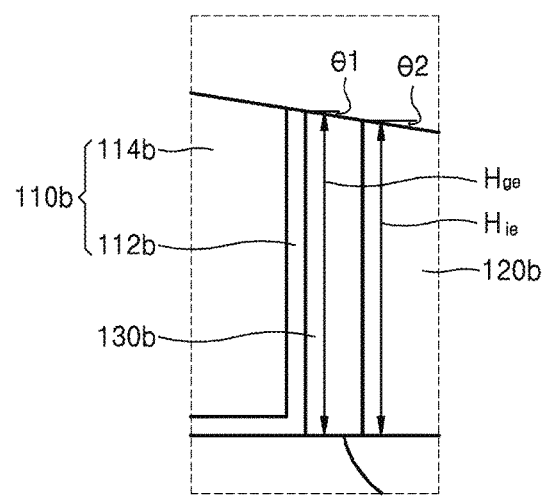
FIG. 3 is an enlarged view illustrating a portion M1 of the semiconductor device of FIG. 2.

FIG. 1 is a schematic plan view illustrating a semiconductor device 100, according to example embodiments. FIG. 2 is a cross-sectional view taken along line I-I' of the semiconductor device 100 of FIG. 1. FIG. 3 is an enlarged view illustrating a portion M1 of the semiconductor device 100 of FIG. 2.

Referring to FIGS. 1 through 3, the semiconductor device 100 of example embodiments may include a semiconductor substrate 101, gate structures 110a and 110b, and interlayer insulating films 120a and 120b.

The semiconductor substrate 101 may include a first region A and a second region B. An active region ACT extending in a first direction (X direction) may be defined by device isolation films 105a and 105b on the semiconductor substrate 101. The first gate structure 110a extending in a second direction (y direction) may be disposed in the first region A. The second gate structure 110b extending in the second direction (y direction) may be disposed in the second region B.

Meanwhile, although the active region ACT is disposed to perpendicularly cross the gate structures 110a and 110b in FIG. 1, the active region ACT and the gate structures 110a and 110b may cross each other at an angle that is not perpendicular. Although one active region ACT crosses the gate structures 110a and 110b in FIG. 1, a plurality of active regions ACT may cross the gate structures 110a and 110b. Furthermore, the active regions ACT of the first region A and the active regions ACT of the second region B extend in the first direction (x direction), whereas they may extend in different directions. The active regions ACT of the first region A and the active regions ACT of the second region B have a same width in the second direction (y direction), whereas they may have different widths in the second direction (y direction).

The semiconductor substrate 101 may be based on a silicon bulk wafer or a silicon on insulator (SOI) wafer. A material of the semiconductor substrate 101 is not limited to silicon. For example, the semiconductor substrate 101 may include a Group IV semiconductor, e.g., germanium (Ge), a Group IV-IV compound semiconductor, e.g., silicon germanium (SiGe) or silicon carbide (SiC), or a Group III-V compound semiconductor, e.g., gallium arsenide (GaAs), indium arsenide (InAs), or indium phosphide (InP). The semiconductor substrate 101 may be based on a SiGe wafer, an epitaxial wafer, a polished wafer and/or an annealed wafer.

The semiconductor substrate 101 may be a p or an n type substrate. For example, the semiconductor substrate 101 may be the p type substrate including p type impurity ions or the n type substrate including n type impurity ions. Meanwhile, as described above, the semiconductor substrate 101 may include the active region ACT defined by the device isolation films 105a and 105b, e.g., shallow trench isolation (STI) on an upper portion thereof. The active region ACT may include an impurity region formed by injecting impurity ions, i.e. dopants, into the semiconductor substrate 101 at a relatively high concentration. For example, the active region ACT may include source/drain regions 107a and 107b formed by injecting dopants more than 1E20/cm3 into the semiconductor substrate 101.

The device isolation films 105a and 105b may be formed to have a structure surrounding the active region ACT as a region defining the active region ACT. The device isolation films 105a and 105b may be disposed between the active regions ACT and electrically isolate the active regions ACT. The device isolation films 105a and 105b may include the first device isolation film 105a disposed in the first region A and the second device isolation film 105b disposed in the second region B. The device isolation films 105a and 105b may include, for example, at least one of a silicon oxide film, a silicon nitride film, a silicon oxynitride film, and a combination of these.

The gate structures 110a and 110b may extend across the active region ACT in the second direction (y direction) on the semiconductor substrate 101 and may be spaced apart from each other in the first direction (x direction) by interlayer insulating films 120a and 120b. The gate structures 110a and 110b may include the first gate structure 110a disposed in the first region A and the second gate structure 110b disposed in the second region B. The interlayer insulating films 120a and 120b may include the first interlayer insulating film 120a disposed in the first region A and the second interlayer insulating film 120b disposed in the second region B. Meanwhile, spacers 130a and 130b may be disposed between the gate structures 110a and 110b and the interlayer insulating films 120a and 120b. The spacers 130a and 130b may include the first spacer 130a disposed in the first region A and the second spacer 130b disposed in the second region B. The spacers 130a and 130b are included in the interlayer insulating films 120a and 120b and are not separately illustrated in FIG. 1.

Meanwhile, when elements are not clearly distinguished as first and second elements below, an element with a reference numeral "a" may indicate a structure formed in the first region A, and an element with a reference numeral "b" may indicate a structure formed in the second region B.

The interlayer insulating films 120a and 120b and the spacers 130a and 130b may be formed to include, for example, at least one of the silicon oxide film, the silicon nitride film, the silicon oxynitride film, and the combination of these. The interlayer insulating films 120a and 120b and the spacers 130a and 130b may be formed of materials having different etch selectivity. For example, when the interlayer insulating films 120a and 120b are formed as the silicon oxide film, the spacers 130a and 130b may be formed as the silicon nitride film.

The gate structures 110a and 110b may include gate insulating films 112a and 112b and metal gate electrodes 114a and 114b. The gate structures 110a and 110b may be distinguished as the first gate structure 110a disposed in the first region A and the second gate structure 110b disposed in the second region B.

The gate insulating films 112a and 112b may be disposed between the metal gate electrodes 114a and 114b and the active region ACT and may be formed of at least one selected from the silicon oxide film, the silicon nitride film, the silicon oxynitride film, oxide/nitride/oxide (ONO) and a high-k dielectric film having a higher dielectric constant than the silicon oxide film. For example, the gate insulating films 112a and 112b may have a dielectric constant in the range of about 10 and about 25.

For specific example, the gate insulating films 112a and 112b may be formed of a metal oxide (e.g., hafnium oxide ($HfO_2$), zirconium oxide ($ZrO_2$), titanium oxide ($TiO_2$), and aluminum oxide ($Al_2O_3$)), a silicate thereof, or an aluminate thereof. The gate insulating films 112a and 112b may be formed of a metal oxynitride (e.g., aluminum oxynitride (AlON), zirconium oxynitride (ZrON), hafnium oxynitride (HfON), lanthanum oxynitride (LaON), and yttrium oxynitride (YON)), a silicate thereof, or an aluminate thereof. Furthermore, the gate insulating films 112a and 112b may be formed of a perovskite-type oxide, a niobate or tantalite system material, a tungsten-bronze system material, or a Bi-layered perovskite system material.

The gate insulating films 112a and 112b may be formed using various deposition methods, e.g., chemical vapor deposition (CVD), low pressure CVD (LPCVD), atmospheric pressure CVD (APCVD), low temperature CVD (LTCVD), plasma-enhanced CVD (PECVD), atomic layer CVD (ALCVD), atomic layer deposition (ALD), or physical vapor deposition (PVD). Meanwhile, the gate insulating films 112a and 112b may be formed between not only the metal gate electrodes 114a and 114b and the active region ACT but also the spacers 130a and 130b and the metal gate electrodes 114a and 114b as shown.

The metal gate electrodes 114a and 114b may be formed as one metal film or at least two metal films. For example, the metal gate electrodes 114a and 114b may include a barrier metal film and an electrode metal film. In this regard, the barrier metal film may include at least one material selected from W, WN, WC, Ti, TiN, Ta, TaN, Ru, Co, Mn, WN, Ni, and NiB, and may be formed as a single layer or a multilayer. The electrode metal film may include at least one of Al, Cu, and W. For example, the electrode metal film may include Cu, CuSn, CuMg, CuNi, CuZn, CuPd, CuAu, CuRe, CuW, W, or W alloy but is not limited thereto. The electrode metal film may also include one or more selected from Al, Au, Be, Bi, Co, Cu, Hf, In, Mn, Mo, Ni, Pb, Pd, Pt, Rh, Re, Ru, Ta, Te, Ti, W, Zn, and Zr, and may have a one or two or more stack structures. The barrier metal film and the electrode metal film may be formed through PVD or CVD but are not limited thereto.

Meanwhile, the gate structures 110a and 110b may include a work function adjusting film between the gate insulating films 112a and 112b and the metal gate electrodes 114a and 114b. The work function adjusting film may include, for example, at least one of TiN, TaC, TaN, and TaCN. In more detail, the gate insulating films 112a and 112b may include a p type metal gate electrode or an n type metal gate electrode according to a channel type of a transistor that is to be formed. For example, when first and second active regions that are spaced apart from each other are defined on the semiconductor substrate 101, a PMOS is formed in the first active region, and an NMOS is formed in the second active region, the gate structures 110a and 110b constituting the PMOS may include the p type metal gate electrode, and the gate structures 110a and 110b constituting the NMOS may include the n type metal gate electrode. Meanwhile, the work function adjusting film may be formed only in a lower portion of the p type metal gate electrode and may not be formed in a lower portion of the n type metal gate electrode.

Meanwhile, a width of the first gate structure 110a of the first region A in the first direction (x direction) may have a first width W1, and a width of the second gate structure 110b of the second region B in the first direction (x direction) may have a second width W2. For example, the first width W1 of the first gate structure 110a may be less than 80 nm, and the second width W2 of the second gate structure 110b may be more than 80 nm. Upon comparing the first width W1 of the first gate structure 110a and the second width W2 of the second gate structure 110b, the second width W2 of the second gate structure 110b may be more than 2 times the first width W1 of the first gate structure 110a. However, the first width W1 of the first gate structure 110a and the second width W2 of the second gate structure 110b are not limited thereto.

In the semiconductor device 100 of example embodiments, it is assumed that thicknesses of the gate insulating films 112a and 112b are relatively small, and the first width W1 of the first gate structure 110a and the second width W2 of the second gate structure 110b are defined to respectively include the thicknesses of the first and second gate insulating films 112a and 112b. However, the first width W1 of the first gate structure 110a and the second width W2 of the second gate structure 110b may be defined as only widths of the first and second metal gate electrodes 114a and 114b excluding thicknesses of the gate insulating films 112a and 112b. The first width W1 of the first gate structure 110a may correspond to a channel length of a transistor formed through the first gate structure 110a in the first direction (x direction). The second width W2 of the second gate structure 110b may correspond to a channel length of a transistor formed through the second gate structure 110b in the first direction (x direction). This may apply below.

A plurality of the first gate structure 110a having the first width W1 may be disposed in the first region A. In this regard, gaps between the plurality of first gate structures 110a in the first direction (x direction) may be similar to the first width W1. In other words, a width of the first interlayer insulating films 120a disposed between the first gate structures 110a in the first direction (x direction) may be similar to the first width W. In this regard, the similarity in width may mean a width in a range of from about ½ times to about 2 times a comparison target. Meanwhile, only one second gate structure 110b having the second width W2 may be disposed in the second region B. A width of the second interlayer insulating film 120b in the first direction (x direction) surrounding both sides of the second gate structure 110b in the first direction (x direction) may be similar to the second width W2 or more than 2 times the second width W2. However, the number of the first gate structures 110a or a width of the first interlayer insulating film 120a in the first direction (x direction) in the first region A and the number of the second gate structures 110b or a width of the second interlayer insulating film 120b in the first direction (x direction) in the second region B are not limited thereto. For example, two second gate structures 110b may be formed in the second region B, and the width of the second interlayer insulating film 120b in the first direction (x direction) between the two second gate structures 110b may be similar to the second width W2.

Meanwhile, an upper surface of the first gate structure 110a may be flat in the first region A. Upper surfaces of the first interlayer insulating films 120a between the first gate structure 110a may also be flat in the first region A. The upper surfaces of the first interlayer insulating films 120a may have a same height as those of the adjacent first gate structures 110a and may constitute one plane since the first gate structures 110a and the first interlayer insulating films 120a therebetween may have relatively narrow widths according to a design rule in the first region A, and thus the upper surfaces of the first gate structures 110a and the upper surfaces of the first interlayer insulating films 120a may be flat during chemical mechanical polishing (CMP) performed on the first gate structures 110a. In addition, the spacers 130a may be disposed between the first gate structures 110a and the first interlayer insulating films 120a, may have upper surfaces having a same height as those of the adjacent first gate structures 110a and first interlayer insulating films 120a, and the upper surfaces of the spacers 130a, the first gate structures 110a and the first interlayer insulating films 120a may also constitute one plane.

An upper surface of the second gate structure 110b may have a convex center portion in the second region B. In other words, the second gate structure 110b may have a center height Hgc from an upper surface Fs of the semiconductor substrate 101 in the center portion and may have an edge height He from the upper surface Fs of the semiconductor substrate 101 in an edge portion. The center height Hgc may be the highest in the second gate structure 110b. The edge height Hge may be the lowest in the second gate structure 110b. In this regard, the second gate structure 110b includes the gate insulating film 112b and the metal gate electrode 114b, and thus the edge portion of the second gate structure 110b may correspond to an edge portion of the gate insulating film 112b. The upper surface of the second gate structure 110b may be gently tapered toward the edge portion from the center portion. For example, the upper surface of the second gate structure 110b may have a first incline θ1 with the upper surface of the semiconductor substrate 101.

Meanwhile, a height of the second interlayer insulating film 120b may get increasingly lower than the upper surface of the semiconductor substrate 101 the farther away from the second gate structure 110b. For example, when an outermost portion of FIG. 2 is the center portion of the second interlayer insulting film 120b farthest from the second gate structure 110b, the center portion of the second interlayer insulting film 120b may have a center height Hic from the upper surface Fs of the semiconductor substrate 101, and an edge portion adjacent to the second gate structure 110b may have an edge height Hie from the upper surface Fs of the semiconductor substrate 101. The center height Hic may be the lowest in the second interlayer insulating film 120b. The edge height Hie may be the highest in the second interlayer insulting film 120b. In this regard, one side surface of the second interlayer insulting film 120b may be adjacent to the second gate structure 110b in the first direction (x direction) and another side surface thereof may be adjacent to another second gate structure 110b or a semiconductor structure other than the second gate structure 110b. The upper surface of the second interlayer insulting film 120b may be gently tapered toward the center portion from the edge portion. For example, the upper surface of the second interlayer insulating film 120b may have a second incline θ2 with the upper surface of the semiconductor substrate 101. Meanwhile, the first incline θ1 and the second incline θ2 may be the same or different.

In addition, the spacers 130b may be disposed between the second gate structure 110b and the second interlayer insulating film 120b as shown, and an upper surface thereof may have a gentle incline with respect to the upper surface of the semiconductor substrate 101. For example, the upper surface of the spacer 130b may have an incline that smoothly connects the edge portion of the second gate structure 110b and the edge portion of the second interlayer insulating film 120b.

In the second region B, the upper surface of the second gate structure 110b and the upper surface of the second interlayer insulating film 120b are formed to have a gentle incline with respect to the semiconductor substrate 101 due to a difference in an etching speed between the second metal gate electrode 114b that is metal and the second interlayer insulating film 120b that is not metal during CPM performed on the second gate structure 110b. For example, when CPM is performed by selecting an appropriate polishing agent, since an etching speed of the second interlayer insulating film 120b is faster than that of the second metal gate electrode 114b, the second interlayer insulating film 120b may be etched faster than the second metal gate electrode 114b. However, an upper surface of the second metal gate electrode 114b and the upper surface of the second interlayer insulating film 120b may not have a step in a boundary portion. Thus, the upper surface of the second metal gate electrode 114b may be higher than the upper surface of the second interlayer insulating film 120b as shown while having a gentle incline and a continuous connection therebetween. The upper surface of the spacer 130b may also be formed according to the same principle, connect the second gate structure 110b and the second interlayer insulating film 120b, and have a gentle incline with respect to the semiconductor substrate 101.

The gate structure 110a of the first region A may generally constitute a transistor of a relatively dense cell region according to the design rule. The gate structure 110b of the second region B may generally constitute a transistor of a logic region or a peripheral region larger than the transistor of the cell region. However, the regions of the gate structure 110a of the first region A and the gate structure 110b of the second region B are not limited thereto. For example, the gate structure 110a of the first region A may be applied to the transistor of the logic region.

Meanwhile, in a boundary portion of the first region A and the second region B of FIG. 2, a height of the second interlayer insulating film 120b of the second region B is lower than that of the first interlayer insulating film 120a of the first region A since the boundary portion corresponds to a center portion of the second interlayer insulating film 120b. Accordingly, if the boundary portion corresponds to an edge portion of the second interlayer insulating film 120b, the height of the second interlayer insulating film 120b may be almost same as the height of the first interlayer insulating film 120a. The gate structure 110a of the first region A may generally constitute the transistor of the cell region. This may apply to other embodiments below.

In the semiconductor device 100 of example embodiments, the first gate structure 110a having a narrow width and a flat upper surface may be disposed in the first region A, and the second gate structure 110b having a broad width and a convex upper surface may be disposed in the second region B. The plurality of first gate structures 110a may be disposed in the first region A. The one second gate structure 110b may be disposed in the second region B. As described above, gate structures having different constructions and different numbers are disposed in the first region A and the second region B, thereby improving entire reliability and operating performance of the semiconductor device 100. For example, the first gate structures 110a having the same construction are formed in the first region A, and thus transistors having a uniform characteristic may be implemented, thereby contributing to an improvement of reliability of the semiconductor device 100. The second gate structures 110b having an edge portion of a gentle incline is formed in the second region B, and thus a defect decreases in the edge portion, a transistor of improved operating performance is implemented, thereby contributing to an improvement of reliability and operating performance of the semiconductor device 100.

FIGS. 4 through 8 are cross-sectional views illustrating semiconductor devices 100a through 100e corresponding to a cross-sectional view of the semiconductor device 100 of FIG. 2, according to example embodiments. The description already made with reference to FIGS. 1 through 3 will be briefly given or omitted for convenience of description.

Figure 4:
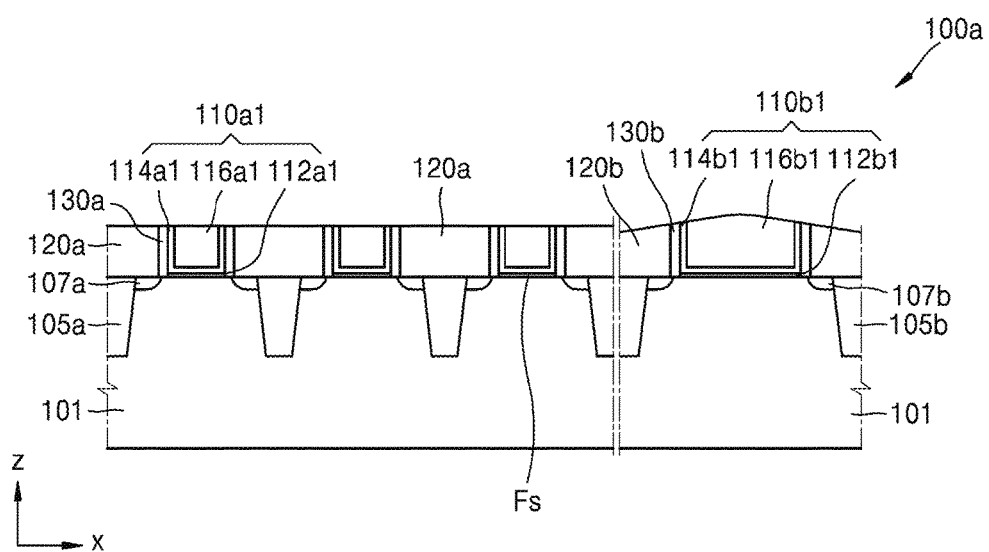
FIGS. 4 through 8 are cross-sectional views illustrating semiconductor devices corresponding to a cross-sectional view of the semiconductor device of FIG. 2, according to example embodiments.

Referring to FIG. 4, the semiconductor device 100a of example embodiments may be different from the semiconductor device 100 of FIGS. 1 through 3 in constructions of gate structures 110a1 and 110b1. For example, each of the first and second gate structures 110a1 and 110b1 may include gate insulating films 112a1 and 112b1, lower metal gate electrodes 114a1 and 114b1, and upper metal gate electrodes 116a1 and 116b1.

The gate insulating films 112a1 and 112b1 may be disposed only between the lower metal gate electrodes 114a1 and 114b1 and the semiconductor substrate 101. That is, the gate insulating films 112a1 and 112b1 may not be formed on side surfaces of the lower metal gate electrodes 114a1 and 114b1. Materials or methods of forming the gate insulating films 112a1 and 112b1 are the same as described with reference to FIGS. 1 through 3 above.

The lower metal gate electrodes 114a1 and 114b1 may include at least one of, for example, TiN, TaN, TaC, TaCN, TiAl, and TiAlC. The lower metal gate electrodes 114a1 and 114b1 may function as a work function adjusting film and/or a barrier metal film. Accordingly, the lower metal gate electrodes 114a1 and 114b1 may include the barrier metal film or may be formed separately from the barrier metal film.

The upper metal gate electrodes 116a1 and 116b1 may correspond to the metal gate electrodes 114a and 114b of the semiconductor device 100 of FIGS. 1 through 3. Accordingly, materials or methods of forming the upper metal gate electrodes 116a1 and 116b1 are the same as described with reference to FIGS. 1 through 3 above.

Although not shown, the first and second gate structures 110a1 and 110b1 may include the work function adjusting films. The work function adjusting films may be formed between the lower metal gate electrodes 114a1 and 114b1 and the upper metal gate electrodes 116a1 and 116b1 or may be formed on lower portions of the lower metal gate electrodes 114a1 and 114b1.

In the semiconductor device 100a of example embodiments, the first gate structure 110a1 disposed in the first region A may have a narrow width and a flat upper surface in a first direction (x direction), and the second gate structure 110b1 disposed in the second region B may have a broad width and a convex upper surface in the first direction (x direction). Detailed descriptions of widths and constructions of the first gate structure 110a1, the second gate structure 110b1, the interlayer insulating films 120a and 120b, and the spacers 130a and 130b are the same as described with reference to FIGS. 1 through 3 above.

Although in the semiconductor device 100 of FIGS. 1 through 3, the first width W1 of the first gate structure 110a and the second width W2 of the second gate structure 110b include thicknesses of the gate insulating films 112a and 112b of side surfaces of the metal gate electrodes 114a and 114b, since in the semiconductor device 100a of example embodiments, the gate insulating films 112a1 and 112b1 are not formed in the side surfaces of the metal gate electrodes 114a and 114b, the first width W1 of the first gate structure 110a1 and the second width W2 of the second gate structure 110b1 may include only widths of the lower metal gate electrodes 114a1 and 114b1 and the upper metal gate electrodes 116a1 and 116b1 in the first direction (x direction).

Figure 5:
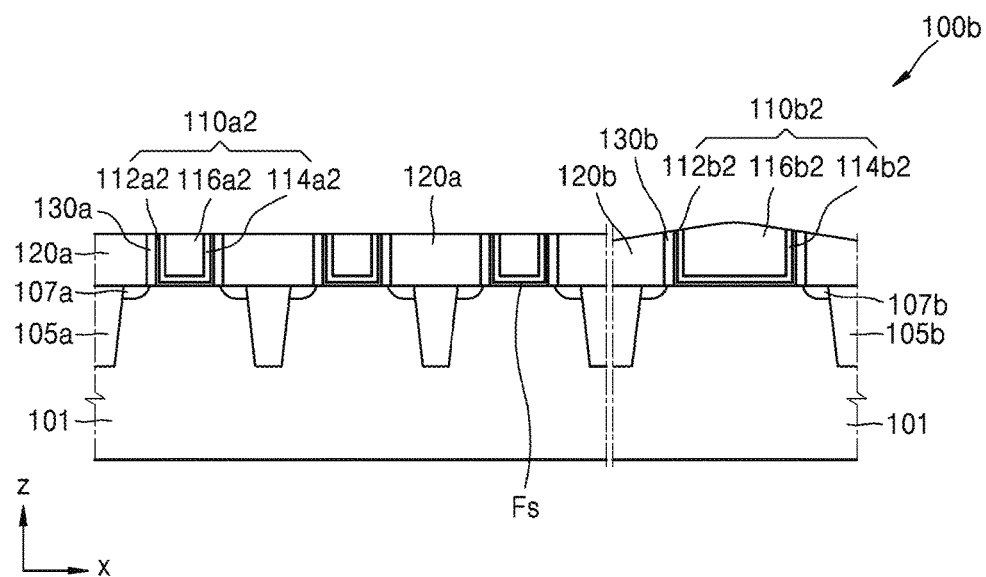

Referring to FIG. 5, the semiconductor device 100b of example embodiments may be different from the semiconductor device 100 of FIGS. 1 through 3 in constructions of gate structures 110a2 and 110b2. For example, each of the first and second gate structures 110a2 and 110b2 may include gate insulating films 112a2 and 112b2, lower metal gate electrodes 114a2 and 114b2, and upper metal gate electrodes 116a2 and 116b2.

Constructions of the gate insulating films 112a2 and 112b2 may be similar to those of the gate structures 112a and 112b of the semiconductor device 100 of FIGS. 1 through 3 above. That is, the gate insulating films 112a2 and 112b2 may be formed on not only lower surfaces of the lower metal gate electrodes 114a2 and 114b2 but also side surfaces thereof. Materials of the gate insulating films 112a2 and 112b2 are the same as described with reference to the semiconductor device 100 of FIGS. 1 through 3 above.

Constructions and materials of the lower metal gate electrodes 114a2 and 114b2 and the upper metal gate electrodes 116a2 and 116b2 are the same as those described with reference to the lower metal gate electrodes 114a1 and 114b1 and the upper metal gate electrodes 116a1 and 116b1 of the semiconductor device 100a of FIG. 4 above.

Figure 6:
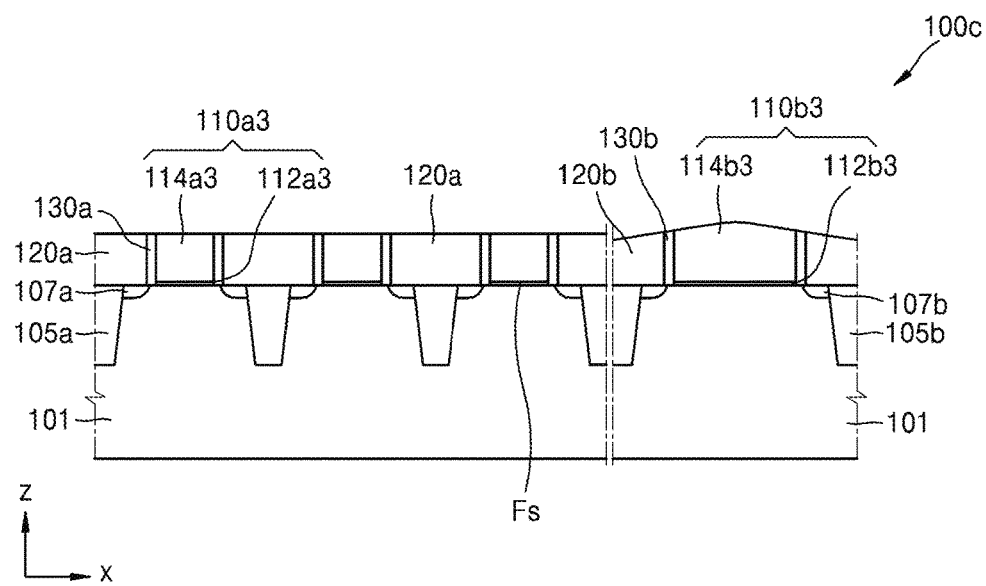

Referring to FIG. 6, the semiconductor device 100c of example embodiments may be different from the semiconductor device 100 of FIGS. 1 through 3 in constructions of gate structures 110a3 and 110b3. For example, each of the first and second gate structures 110a3 and 110b3 may include gate insulating films 112a3 and 112b3 and metal gate electrodes 114a3 and 114b3.

The gate insulating films 112a3 and 112b3 may be disposed only between the metal gate electrodes 114a3 and 114b3 and the semiconductor substrate 101 as in the semiconductor device 100a of FIG. 4, and may not be formed on side surfaces of the metal gate electrodes 114a3 and 114b3.

The metal gate electrodes 114a3 and 114b3 may be formed on the gate insulating films 112a3 and 112b3 and may include barrier metal films on the outside thereof. Materials or methods of forming the metal gate electrodes 114a3 and 114b3 are the same as those described with reference to the semiconductor device 100 of FIGS. 1 through 3 above.

Figure 7:
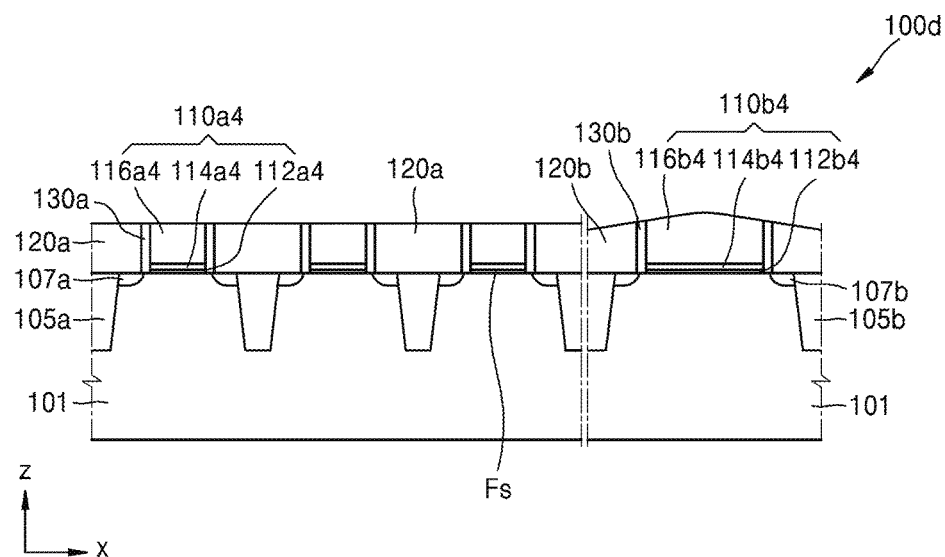

Referring to FIG. 7, the semiconductor device 100d of example embodiments may be different from the semiconductor device 100 of FIGS. 1 through 3 in constructions of gate structures 110a4 and 110b4. For example, each of the first and second gate structures 110a4 and 110b4 may include gate insulating films 112a4 and 112b4, lower metal gate electrodes 114a4 and 114b4, and upper metal gate electrodes 116a4 and 116b4.

The gate insulating films 112a4 and 112b4 may be disposed only between the lower metal gate electrodes 114a4 and 114b4 and the semiconductor substrate 101 as in the semiconductor device 100a of FIG. 4. The lower metal gate electrodes 114a4 and 114b4 may be formed only between the upper metal gate electrodes 116a4 and 116b4 and the gate insulating films 112a4 and 112b4. That is, the lower metal gate electrodes 114a4 and 114b4 may not be formed on side surfaces of the upper metal gate electrodes 116a4 and 116b4 unlike in the semiconductor device 100a of FIG. 4.

Materials or methods of forming the gate insulating films 112a4 and 112b4, the lower metal gate electrodes 114a4 and 114b4, and the upper metal gate electrodes 116a4 and 116b4 are the same as those described with reference to the semiconductor device 100a of FIG. 4 above.

In the semiconductor devices 100b, 100c, and 100d of FIGS. 5 through 7, the first gate structures 110a2, 110a3, and 110a4 disposed in the first region A may have narrow widths and flat upper surfaces in the first direction (x direction), and the second gate structures 110b2, 110b3, and 110b4 disposed in the second region B may have broad widths and convex upper surfaces in the first direction (x direction). As described with reference to the semiconductor device 100 of FIGS. 1 through 3 above, upper surfaces of the first gate structures 110a2, 110a3, and 110a4, the spacer 130a, and the interlayer insulating film 120a may have a same height and constitute one plane in the first region A, and upper surfaces of the second gate structures 110b2, 110b3, and 110b4, the spacer 130b, and the interlayer insulating film 120b may have gentle inclines tapered toward a center potion of the interlayer insulating film 120b from center portions of the second gate structures 110b2, 110b3, and 110b4.

Figure 8:
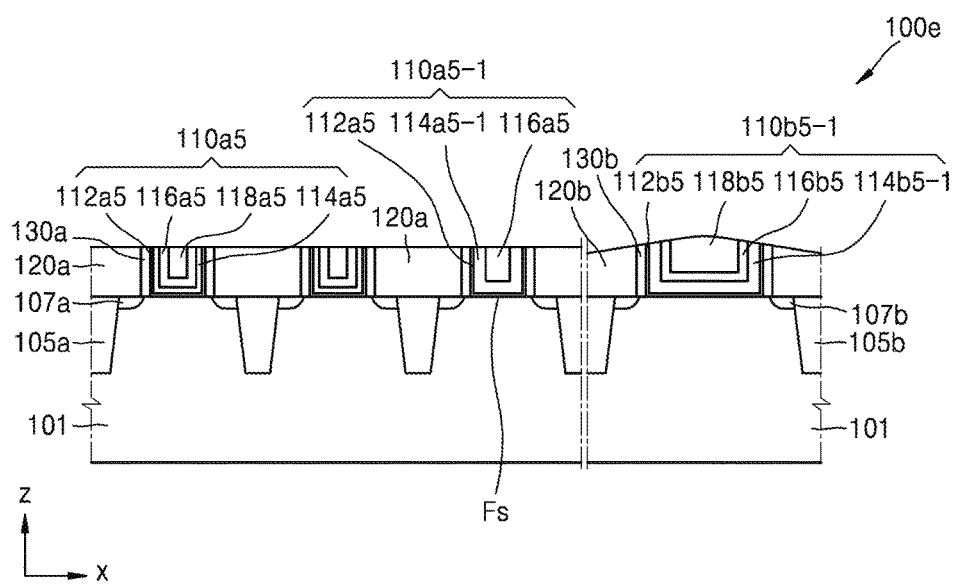

Referring to FIG. 8, the semiconductor device 100e of example embodiments may be different from the semiconductor devices 100, 100a, 100b, 100c, and 100d in constructions of gate structures 110a5, 110a5-1, and 110b5-1. For example, the n type first gate structure 110a5 and the p type first gate structure 110a5-1 may be formed in the first region A, and the second gate structure 110b5-1 may be formed in the second region B.

The n type first gate structure 110a5 may include a gate insulating film 112a5, a lower metal gate electrode 114a5, a barrier metal film 116a5, and an upper metal gate electrode 118a5. The gate insulating film 112a5 may be formed to surround lower and side surfaces of the lower metal gate electrode 114a5. A material or a method of forming the gate insulating film 112a5 are the same as that described with reference to the semiconductor device 100 of FIGS. 1 through 3 above.

The lower metal gate electrode 114a5 may be formed on the gate insulating film 112a5 to surround lower and side surfaces of the barrier metal film 116a5. The lower metal gate electrode 114a5 may include at least one of, for example, TiN, TaN, TaC, TaCN, TiAl, and TiAlC, and may function as the work function adjusting film. In the semiconductor device 100e of example embodiments, the lower metal gate electrode 114a5 may be formed of TiAlC. Although not shown, the lower metal gate electrode 114a5 may include a capping film formed to be thin on the gate insulating film 112a5. The capping film may function as a barrier metal film, and may be formed of, for example, TiN.

The barrier metal film 116a5 may be formed to surround lower and side surfaces of the upper metal gate electrode 118a5 on the lower metal gate electrode 114a5. The barrier metal film 116a5 may include at least one material selected from W, WN, WC, Ti, TiN, Ta, TaN, Ru, Co, Mn, WN, Ni, and NiB, and may be formed as a single layer or a multilayer. In the semiconductor device 100e of example embodiments, the barrier metal film 116a5 may be formed of TiN.

The upper metal gate electrode 118a5 may be formed on the barrier metal film 116a5. The upper metal gate electrode 118a5 may correspond to the metal gate electrodes 114a and 114b of the semiconductor device 100 of FIGS. 1 through 3. Accordingly, a material or a method of forming the upper metal gate electrode 118a5 is the same as that described with reference to the semiconductor device 100 of FIGS. 1 through 3 above. In the semiconductor device 100e of example embodiments, the upper metal gate electrode 118a5 may be formed of, for example, W.

The p type first gate structure 110a5-1 may include the gate insulating film 112a5, a lower metal gate electrode 114a5-1, and the barrier metal film 116a5. A construction, a material, and a method of forming the gate insulating film 112a5 are the same as those described with reference to the gate insulating film 112a5 of the n type first gate structure 110a5 above.

The lower metal gate electrode 114a5-1 may be formed on the gate insulating film 112a5 to surround lower and side surfaces of the barrier metal film 116a5. The lower metal gate electrode 114a5-1 may be thicker than the lower metal gate electrode 114a5 of the n type first gate structure 110a5. The lower metal gate electrode 114a5-1 may further include, for example, a p type work function adjusting film. In other words, the lower metal gate electrode 114a5-1 may include the p type work function adjusting film and a common work function adjusting film corresponding to the lower metal gate electrode 114a5 of the n type first gate structure 110a5. The p type work function adjusting film may be formed of, for example, TiN. The common work function adjusting film may be formed of TiAlC. Meanwhile, the lower metal gate electrode 114a5-1 may further include a capping film between the p type work function adjusting film and the common work function adjusting film. The capping film may be formed of TiN, like the p type work function adjusting film.

The barrier metal film 116a5 may be formed on the lower metal gate electrode 114a5-1. The barrier metal film 116a5 may be formed of the same material as that of the barrier metal film 116a5 of the n type first gate structure 110a5. For example, the barrier metal film 116a5 may be formed of TiN. The upper metal gate electrode 118a5 may not be formed in the p type first gate structure 110a5-1 since a space in which the upper metal gate electrode 118a5 is to be formed is insufficient due to the lower metal gate electrode 114a5-1 that is formed to be thick. This will be described in more detail with reference to FIGS. 24A through 24D. However, the upper metal gate electrode 118a5 may be formed in the p type first gate structure 110a5-1. For example, when the lower metal gate electrode 114a5-1 is formed to be thin or a width of the type first gate structure 110a5-1 in the first direction (x direction) is broad, the upper metal gate electrode 118a5 may be formed in the p type first gate structure 110a5-1.

The second gate structure 110b5-1 may include a gate insulating film 112b5, a lower metal gate electrode 114b5-1, a barrier metal film 116b5, and an upper metal gate electrode 118b5. The second gate structure 110b5-1 may be similar to the n type first gate structure 110a5 in a layer structure, whereas the second gate structure 110b5-1 may be different from the n type first gate structure 110a5 in that the lower metal gate electrode 114b5-1 is formed of the same material and construction as those of the lower metal gate electrode 114a5-1 of the p type first gate structure 110a5-1.

In other words, the gate insulating film 112b5, the barrier metal film 116b5, and the upper metal gate electrode 118b5 of the second gate structure 110b5-1 are the same as the gate insulating film 112a5, the barrier metal film 116a5, and the upper metal gate electrode 118a5 of the n type first gate structure 110a5, respectively. The lower metal gate electrode 114b5-1 of the of the second gate structure 110b5-1 may include a p type work function adjusting film, a capping film, a common work function adjusting film, and may be thicker than the lower metal gate electrode 114a5 of the n type first gate structure 110a5.

Meanwhile, a width of the second gate structure 110b5-1 in the first direction (x direction) may be greater than that of the p type first gate structure 110a5-1 in the first direction (x direction), and thus the upper metal gate electrode 118b5 may be formed on the barrier metal film 116b5.

In the semiconductor device 100e of example embodiments, the lower metal gate electrode 114b5-1 of the second gate structure 110b5-1 of the second region B is formed of the same construction and material as those of the lower metal gate electrode 114a5-1 of the p type first gate structure 110a5-1, whereas the lower metal gate electrode 114b5-1 of the second gate structure 110b5-1 of the second region B may be formed of the same construction and material as those of the lower metal gate electrode 114a5 of the n type first gate structure 110a5 according to a function. Although only one p type first gate structure 110a5-1 is formed in the first region A, the number of the n type first gate structure 110a5 and the p type first gate structure 110a5-1 is not limited and may be adjusted in various ways. Furthermore, the n type first gate structure 110a5 and the p type first gate structure 110a5-1 are not mixed in the first region A but one channel type first gate structure may be only disposed.

In the semiconductor device 100e of example embodiments, the n type first gate structure 110a5 and the p type first gate structure 110a5-1 disposed in the first region A may have narrow widths and flat upper surfaces in the first direction (x direction), and the second gate structure 110b5-1 disposed in the second region B may have a broad width and a convex upper surface in the first direction (x direction). Meanwhile, widths of the n type first gate structure 110a5 and the p type first gate structure 110a5-1 in the first direction (x direction) may be the same in the first region A. However, one of the widths of the n type first gate structure 110a5 and the p type first gate structure 110a5-1 may be greater according to circumstances.

As described with reference to the semiconductor device 100 of FIGS. 1 through 3 above, upper surfaces of the n type first gate structure 110a5, the p type first gate structure 110a5-1, the spacer 130a, and the interlayer insulating film 120a of the semiconductor device 100e of example embodiments may have a same height and constitute one plane in the first region A, and upper surfaces of the second gate structure 110b5-1, the spacer 130b, and the interlayer insulating film 120b may have gentle inclines tapered toward a center potion of the interlayer insulating film 120b from a center portion of the second gate structure 110b5-1 in the second region B.

The semiconductor devices 100, 100a, 100b, 100c, 100d, and 100e including gate structures of various constructions are described above. However, the inventive concepts are not limited to the semiconductor devices 100, 100a, 100b, 100c, 100d, and 100e. For example, when a gate structure has a narrow width corresponding to a channel length and a flat upper surface in one region, and another gate structure has a broad width corresponding to a channel length and a convex upper surface in another region, a semiconductor device may belong to the inventive concepts irrespective of constructions of the gate structures.

Figure 9:
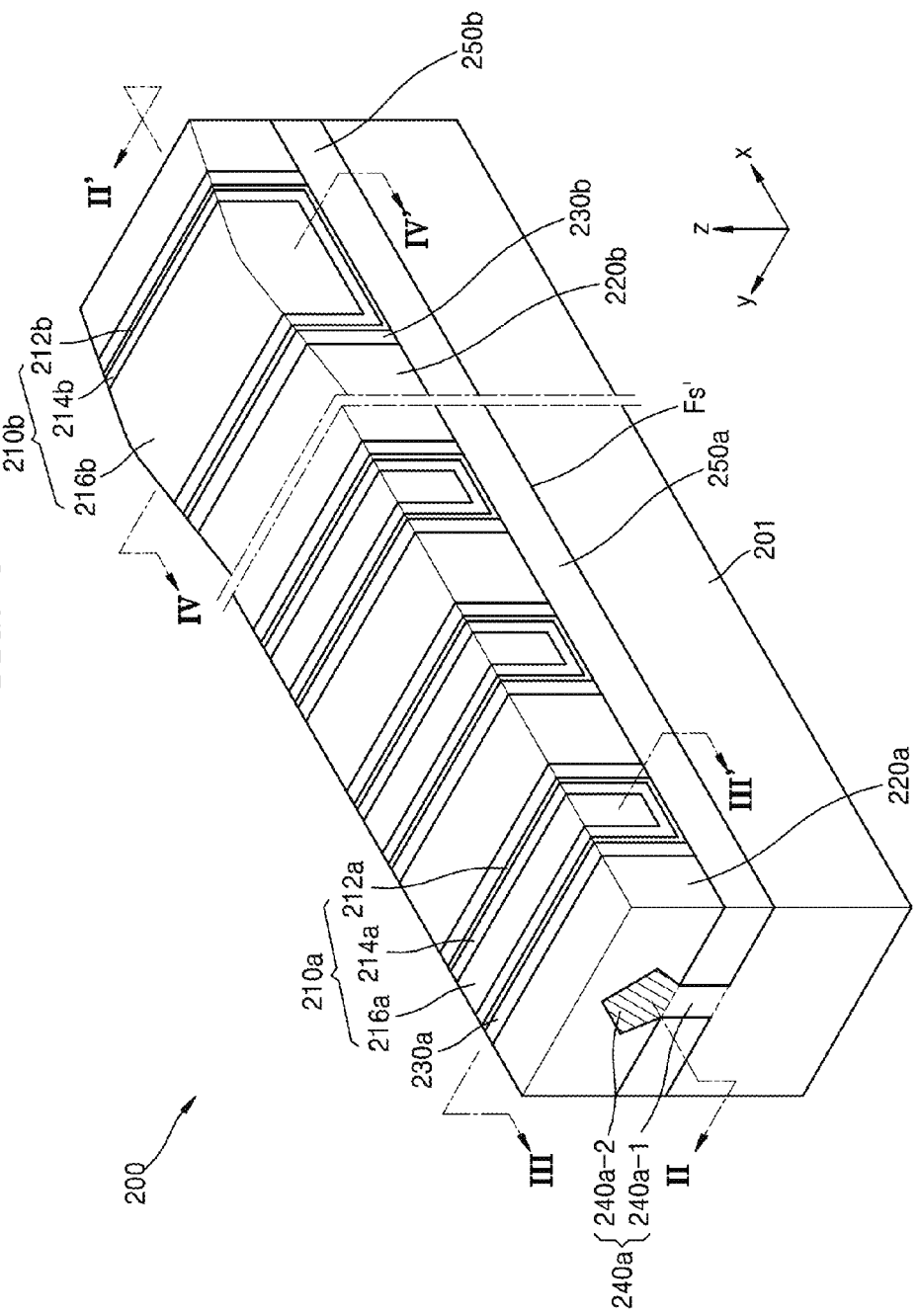
FIG. 9 is a perspective view illustrating a semiconductor device, according to example embodiments.
Figure 10:
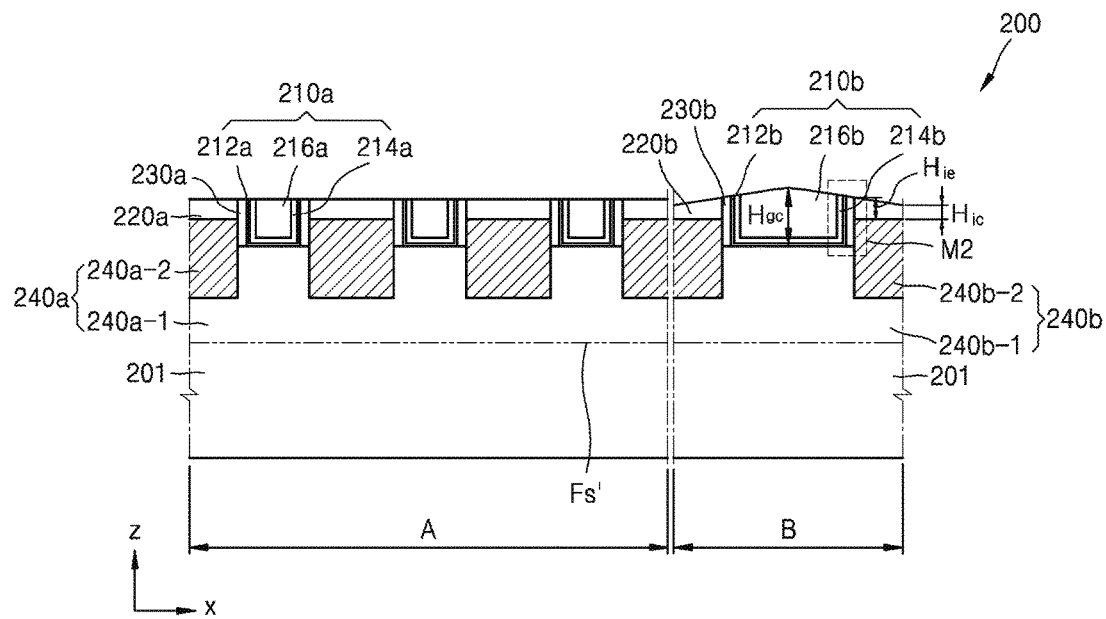
FIG. 10 is a cross-sectional view taken along a line II-II' of the semiconductor device of FIG. 9.
Figure 11:
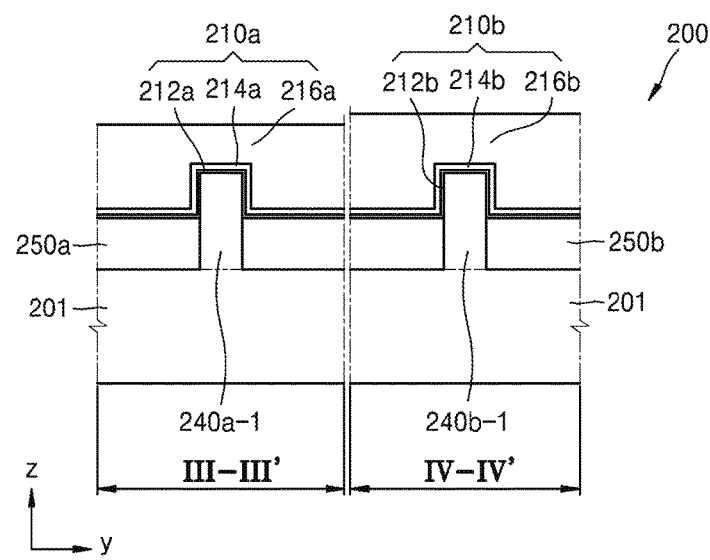
FIG. 11 is a cross-sectional view taken along lines III-III' and IV-IV' of the semiconductor device of FIG. 9.
Figure 12:
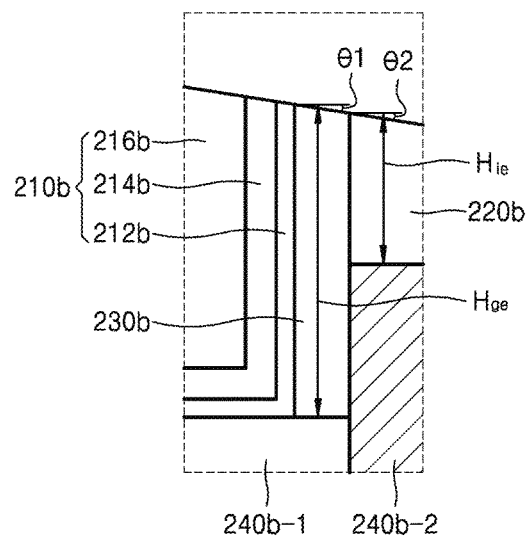
FIG. 12 is an enlarged view illustrating a portion M2 of the semiconductor device of FIG. 10.

FIG. 9 is a perspective view illustrating a semiconductor device 200, according to example embodiments. FIG. 10 is a cross-sectional view taken along line II-II' of the semiconductor device 200 of FIG. 9. FIG. 11 is a cross-sectional view taken along lines III-III' and IV-IV' of the semiconductor device 200 of FIG. 9. FIG. 12 is an enlarged view illustrating a portion M2 of the semiconductor device 200 of FIG. 10.

Referring to FIGS. 9 through 12, the semiconductor device 200 of example embodiments may include an active area having a structure of fins 240a and 240b on the semiconductor substrate 201. The first region A and the second region B may respectively correspond to the first region A and the second region B of the semiconductor device 100 of FIGS. 1 through 3.

In more detail, the semiconductor device 200 of example embodiments may include a semiconductor substrate 201, the fins 240a and 240b, device isolation films 250a and 250b, gate structures 210a and 210b, and interlayer insulation films 220a and 220b.

The semiconductor substrate 201 may correspond to the semiconductor substrate 101 of the semiconductor device 100 of FIGS. 1 through 3, and thus a detailed description thereof is omitted.

The fins 240a and 240b may have a structure in which the fins 240a and 240b protrude from the semiconductor substrate 201 and extend in the first direction (x direction). A plurality of fins 240a and 240b may be formed on the semiconductor substrate 201 in the second direction (y direction). The fins 240a and 240b may include the first fin 240a of the first region A and the second fin 240b of the second region B. The first fins 240a and the second fin 240b may be electrically insulated from each other through a device isolation film. However, the first fin 240a and the second fin 240b may be connected to each other. Although the first fin 240a and the second fin 240b extend in the same direction in example embodiments, the first fin 240a and the second fin 240b may extend in different directions.

Each of the first fin 240a and the second fin 240b may include lower fins 240a-1 and 240b-1 and upper fins 240a-2 and 240b-2. The lower fins 240a-1 and 240b-1 may be formed based on the semiconductor substrate 101. The upper fins 240a-2 and 240b-2 may be formed as epitaxial films grown from the lower fins 240a-1 and 240b-1. As shown in FIG. 10, the upper fins 240a-2 and 240b-2 may constitute a source/drain region with respect to the gate structures 210a and 210b, and the lower fins 240a-1 and 240b-1 may constitute a channel region in a lower portion of the gate structures 210a and 210b.

When the first fin 240a and the second fin 240b include the upper fins 240a-2 and 240b-2 formed as the epitaxial films, the first fin 240a and the second fin 240b may include silicon or germanium that is a semiconductor element. The first fin 240a and the second fin 240b may include a compound semiconductor, e.g., a Group IV-IV compound semiconductor or a Group III-V compound semiconductor. For example, the first fin 240a and the second fin 240b may include, as the Group IV-IV compound semiconductor, a binary compound or a ternary compound including at least two or more elements from among carbon (C), silicon (Si), germanium (Ge), and tin (Sn), or a compound in which the binary compound or the ternary compound is doped with a Group IV element. The first fin 240a and the second fin 240b may include, as the Group III-V compound semiconductor, one of a binary compound, a ternary compound, and a quaternary compound that are formed by combining at least one of aluminum (Al), gallium (Ga), and indium (In) as a Group III element and one of phosphorus (P), arsenic (As), and antimony (Sb). Structures and methods of forming the first fin 240a and the second fin 240b will be described in more detail with reference to FIGS. 25A through 26G.

Meanwhile, the upper fins 240a-2 and 240b-2 of the fins 240a and 240b may be formed in both sides of the gate structures 210a and 210b on the lower fins 240a-1 and 240b-1 and may include a compression stress material or a tensile stress material according to a channel type of a required transistor. For example, when a p type transistor is formed, the upper fins 240a-2 and 240b-2 of the fins 240a and 240b formed in both sides of the gate structures 210a and 210b may include the compression stress material. In more detail, when the lower fins 240a-1 and 240b-1 are formed of silicon, the upper fins 240a-2 and 240b-2 may be formed of a material having a greater grid constant than silicon, for example, silicon germanium (SiGe), as the compression stress material. When an n type transistor is formed, the upper fins 240a-2 and 240b-2 of the fins 240a and 240b formed in both sides of the gate structures 210a and 210b may include the tensile stress material. In more detail, when the lower fins 240a-1 and 240b-1 are formed of silicon, the upper fins 240a-2 and 240b-2 may be formed of silicon or a material having a smaller grid constant than silicon, for example, silicon carbide (SiC), as the tensile stress material.

In addition, the upper fins 240a-2 and 240b-2 may have various shapes in the semiconductor device 200 of example embodiments. For example, the upper fins 240a-2 and 240b-2 may have various shapes, e.g., diamond, circular, oval, and polygonal shapes, on a cross-sectional surface perpendicular to the first direction (x direction). FIG. 9 illustrates an example pentagonal diamond shape.

The device isolation films 250a and 250b may be formed on the semiconductor substrate 201 and may include the first device isolation film 250a of the first region A and the second device isolation film 250b of the second region B. The first device isolation film 250a may be formed to surround both side surfaces of the lower fin 240a-1 of the first fin 240a. The second device isolation film 250b may be formed to surround both side surfaces of the lower fin 240b-1 of the second fin 240b.

The device isolation films 250a and 250b may correspond to the device isolation films 105a and 105b of the semiconductor device 100 of FIGS. 1 through 3 and may function to electrically isolate fins arranged in the second direction (y direction). The device isolation films 250a and 250b may include at least one of, for example, a silicon oxide film, a silicon nitride film, a silicon oxynitride film, and a combination of these. A part of the device isolation films 250a and 250b may electrically isolate the first fin 240a and the second fin 240b.

Meanwhile, the upper fins 240a-2 and 240b-2 of the fins 240a and 240b may protrude without being surrounded by the device isolation films 250a and 250b. As shown in FIG. 11, the lower fins 240a-1 and 240b-1 of the fins 240a and 240b disposed in lower portions of the gate structures 210a and 210b may protrude from the device isolation films 250a and 250b.

The gate structures 210a and 210b may extend in the second direction (y direction) across the fins 240a and 240b on the device isolations films 250a and 250b and may be disposed in the first direction (x direction). The gate structures 210a and 210b may include the first gate structure 210a of the first region A and the second gate structure 210b of the second region B.

The gate structures 210a and 210b may respectively correspond to the gate structures 110a and 110b of the semiconductor device 100 of FIGS. 1 through 3. However, in the semiconductor device 200 of example embodiments, the gate structures 210a and 210b may include gate insulating films 212a and 212b, lower metal gate electrodes 214a and 214b, and upper metal gate electrodes 216a and 216b, similarly to the semiconductor device 100b of FIG. 5.

The first gate structure 210a may be formed to surround the first fin 240a. The second gate structure 210b may be formed to surround the second fin 240b. In more detail, the first gate structure 210a may be formed to surround a part of upper and side surfaces of the lower fin 240a-1 of the first fin 240a, and the second gate structure 210b may be formed to surround a part of upper and side surfaces of the lower fin 240b-1 of the second fin 240b. Structures of the gate structures 210a and 210b will be more clearly described with reference to FIGS. 25a through 26G. Materials or methods of forming the gate structures 210a and 210b are the same as those described with reference to the semiconductor device 100 of FIGS. 1 through 3 and the semiconductor device 100b of FIG. 5, except for the structures thereof.

The interlayer insulating films 220a and 220b may be formed to cover the fins 240a and 240b on the device isolation films 250a and 250b. The interlayer insulating films 220a and 220b may include the first interlayer insulating film 220a of the first region A and the second interlayer insulating film 220b of the second region B. The first interlayer insulating film 220a may cover the first fin 240a on the first device isolation film 250a and may be formed between the first gate structures 210a. The second interlayer insulating film 220b may cover the second fin 240b on the second device isolation film 250b and may be formed on both side surfaces of the second gate structures 210b.

The interlayer insulating films 220a and 220b may have a structure to surround a part of upper and side surfaces of the fins 240a and 240b according to the protruding fins 240a and 240b that are active regions. In more detail, the interlayer insulating films 220a and 220b may be formed as a structure surrounding the upper fins 240a-2 and 240b-2 of the fins 240a and 240b. The interlayer insulating films 220a and 220b may respectively correspond to the interlayer insulating films 120a and 120b of the semiconductor device 100 of FIGS. 1 through 3. Thus, materials or methods of forming the interlayer insulating films 220a and 220b are the same as those described with reference to the semiconductor device 100 of FIGS. 1 through 3.

Spacers 230a and 230b may be formed between the interlayer insulating films 220a and 220b and the gate structures 210a and 210b. The spacers 230a and 230b may surround both side surfaces of the gate structures 210a and 210b, extend in the second direction (y direction), and, similarly to the gate structures 210a and 210b, may surround upper and side surfaces of the fins 240a and 240b across the fins 240a and 240b. The spacers 230a and 230b may respectively correspond to the spacers 130a and 130b of the semiconductor device 100 of FIGS. 1 through 3. Thus, materials or methods of forming the spacers 230a and 230b are the same as those described with reference to the semiconductor device 100 of FIGS. 1 through 3.

Similarly to the semiconductor devices 100, 100*a*, 100*b*, 100*c*, 100*d*, and 100*e* of FIGS. 1 through 8 described above, in the semiconductor device 200 of example embodiments, a width of the first gate structure 210*a* in the first direction (x direction) may be small, and a width of the second gate structure 210*b* in the first direction (x direction) may be broad. For example, the width of the first gate structure 210*a* in the first direction (x direction) may be less than 80 nm, and the width of the second gate structure 210*b* in the first direction (x direction) may be more than 80 nm. Upon comparing the first gate structure 210*a* and the second gate structure 210*b*, the width of the second gate structure 210*b* in the first direction (x direction) may be more than two times the width of the first gate structure 210*a* in the first direction (x direction). The widths of the first gate structure 210*a* and the second gate structure 210*b* in the first direction (x direction) are not limited to the above numerical values.

As shown in FIG. 10, upper surfaces of the first gate structure 210*a*, the first interlayer insulating film 220*a*, and the spacer 230*a* may be flat and may have a same height from an upper surface Fs' of the semiconductor substrate 201. Accordingly, the first gate structure 210*a*, the first interlayer insulating film 220*a*, and the spacer 230*a* may have one flat upper surface. Meanwhile, an upper surface of the second gate structure 210*b* may be convex in the center thereof and may be lower toward the outside. In more detail, the second gate structure 210*b* may have a center height Hgc from an upper surface of the lower fin 240*b*-1 in a center portion and an edge height Hge from the upper surface of the lower fin 240*b*-1 in an edge portion. The center height Hgc may be the highest in the second gate structure 210*b*. The edge height He may be the lowest in the second gate structure 210*b*. The second interlayer insulating film 220*b* may have a center height Hic from an upper surface of the upper fin 240*b*-2 in a center portion and an edge height Hie from the upper surface of the upper fin 240*b*-2 in an edge portion adjacent to the second gate structure 210*b*. The center height Hic may be the lowest in the second interlayer insulating film 220*b*. The edge height Hie may be the highest in the second interlayer insulating film 220*b*. An upper surface of the spacer 230*b* disposed between the second gate structure 210*b* and the second interlayer insulating film 220*b* may have a gentle incline with respect to the upper surface Fs' of the semiconductor substrate 201. The upper surface of the spacer 230*b* may have an incline that smoothly connects the edge portion of the second gate structure 210*b* and the edge portion of the second interlayer insulating film 220*b*.

The heights of the upper surface of the second gate structure 210*b* and the upper surface of the second interlayer insulating film 220*b* are described above with respect to cross-sections taken along the line II-II' of FIG. 9, i.e. center portions of the fins 240*a* and 240*b* in the second direction (y direction). If other cross-sections are used instead of portions including the fins 240*a* and 240*b*, the heights of the upper surface of the second gate structure 210*b* and the upper surface of the second interlayer insulating film 220*b* may be described with respect to the upper surface Fs' of the semiconductor substrate 201 or upper surfaces of the device isolation films 250*a* and 250*b*. Although the upper surface Fs' of the semiconductor substrate 201 or upper surfaces of the device isolation films 250*a* and 250*b* is used, the heights of the upper surface of the second gate structure 210*b* and the upper surface of the second interlayer insulating film 220*b* may be almost the same as described above.

In the semiconductor device 200 of example embodiments, the first gate structure 210*a* of the first region A in the first direction (x direction) may have a small width and an flat upper surface, and the second gate structure 210*b* of the second region B in the first direction (x direction) may have a broad width and a convex upper surface. The first gate structure 210*a*, the first interlayer insulating film 220*a*, and the spacer 230*a* may have the same height and one flat upper surface in the first region A. The second gate structure 210*b*, the second interlayer insulating film 220*b*, and the spacer 230*b* may have the gentle incline lowering toward the center portion of the interlayer insulating film 220*b* from the center portion of the second gate structure 210*b* in the second region B.

Figure 13:
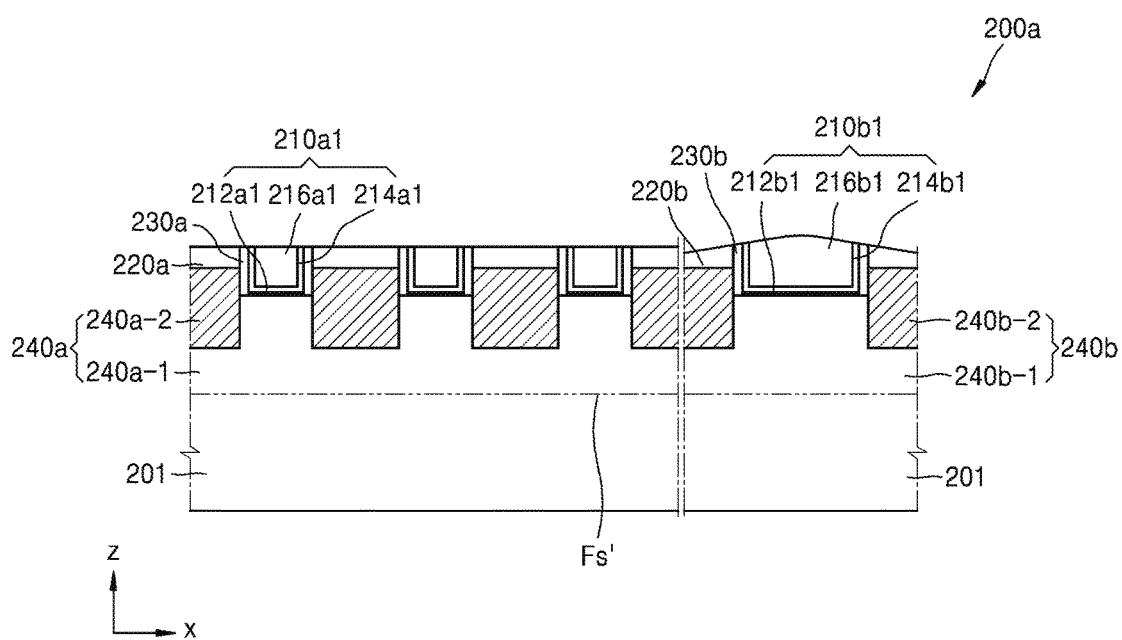
FIG. 13 is a cross-sectional view illustrating a semiconductor device corresponding to a cross-sectional view of the semiconductor device of FIG. 10, according to example embodiments.

FIG. 13 is a cross-sectional view illustrating a semiconductor device 200*a* corresponding to a cross-sectional view of the semiconductor device of FIG. 10, according to example embodiments. The description already made with reference to FIGS. 9 through 12 will be briefly given or omitted for convenience of description.

Referring to FIG. 13, the semiconductor device 200*a* of example embodiments may be different from the semiconductor device 200 of FIGS. 9 through 12 in the construction of gate structures 210*a*1 and 210*b*1. For example, each of the first gate structure 210*a*1 and the second gate structure 210*b*1 may include gate insulating films 212*a*1 and 212*b*1, lower metal gate electrodes 214*a*1 and 214*b*1, and upper metal gate electrodes 216*a*1 and 216*b*1.

The gate insulating films 212*a*1 and 212*b*1 may be disposed only between the lower metal gate electrodes 214*a*1 and 214*b*1 and the lower fins 240*a*-1 and 240*b*-1, similarly to the semiconductor device 100*a* of FIG. 4. That is, the gate insulating films 212*a*1 and 212*b*1 may not be formed in side surfaces of the lower metal gate electrodes 214*a*1 and 214*b*1. Accordingly, materials or methods of forming the gate insulating films 212*a*1 and 212*b*1 are the same as those described with reference to the semiconductor device 100*a* of FIG. 4.

Materials or methods of forming the lower metal gate electrodes 214*a*1 and 214*b*1 and the upper metal gate electrodes 216*a*1 and 216*b*1 are the same as those described with reference to the semiconductor device 100*a* of FIG. 4. However, the gate structures 210*a*1 and 210*b*1 are formed to surround a part of upper and lower surfaces of the fins 240*a* and 240*b*, and thus the gate insulating films 212*a*1 and 212*b*1, the lower metal gate electrodes 214*a*1 and 214*b*1, and the upper metal gate electrodes 216*a*1 and 216*b*1 may be formed to surround a part of the upper and side surfaces of the fins 240*a* and 240*b*.

In addition, the first gate structure 210*a*1 and the second gate structure 210*b*1 may include a work function adjusting film. The work function adjusting film may be formed between the lower metal gate electrodes 214*a*1 and 214*b*1 and the upper metal gate electrodes 216*a*1 and 216*b*1 or may be formed in lower surfaces of the lower metal gate electrodes 214*a*1 and 214*b*1.

In the semiconductor device 200*a* of example embodiments, the first gate structure 210*a*1 disposed in the first region A in the first direction (x direction) may also have a small width and an flat upper surface, and the second gate structure 210*ba* disposed in the second region B in the first direction (x direction) may also have a broad width and a convex upper surface. Widths and constructions of the first gate structure 210*a*1, the second gate structure 210*b*1, the interlayer insulating films 220*a* and 220*b*, and the spacers 230*a* and 230*b* are the same as described with reference to FIGS. 9 through 12.

Figure 14:
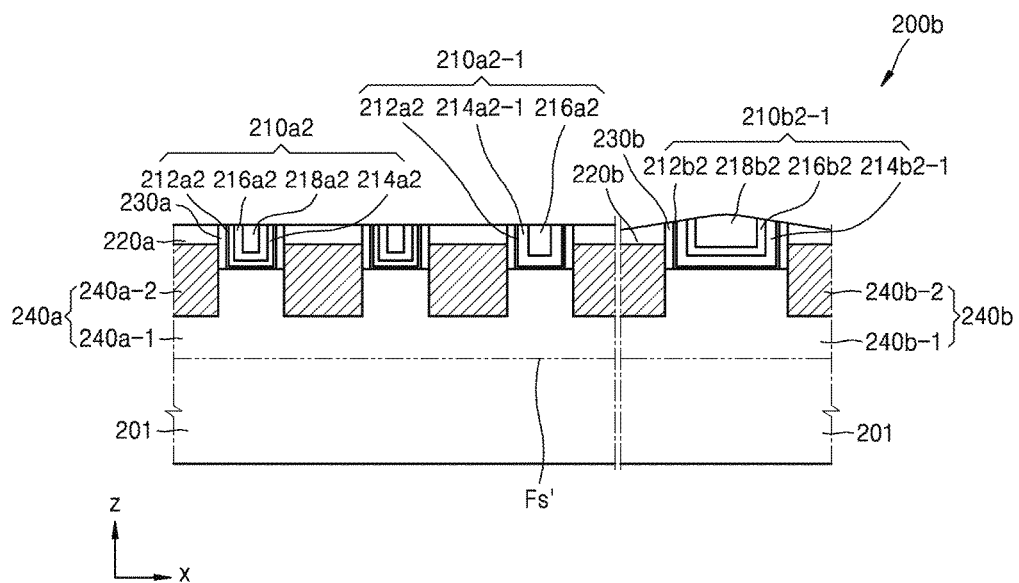
FIGS. 14 and 15 are cross-sectional views illustrating a semiconductor device, respectively, corresponding to cross-sectional views of the semiconductor devices of FIGS. 10 and 11, according to example embodiments.
Figure 15:
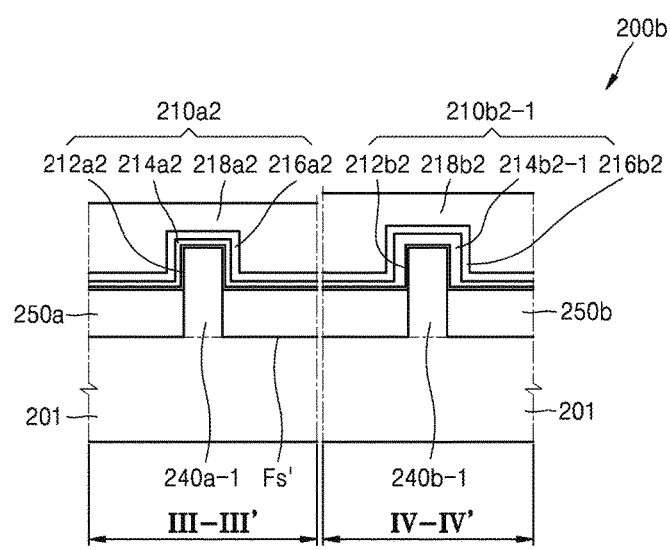

FIGS. 14 and 15 are cross-sectional views illustrating a semiconductor device 200*b*, respectively, corresponding to cross-sectional views of the semiconductor devices of FIGS.

10 and 11, according to example embodiments. The description already made with reference to FIGS. 9 through 12 will be briefly given or omitted for convenience of description.

Referring to FIGS. 14 and 15, the semiconductor device 200b of example embodiments may be different from the semiconductor device 200 of FIGS. 9 through 12 or the semiconductor device 200a of FIG. 13 in the construction of gate structures 210a2, 210a2-1, and 210b2-1. For example, the semiconductor device 200b of example embodiments may include the n type first gate structure 210a2 and the p type first gate structure 210a2-1 in the first region A, and the second gate structure 210b2-1 in the second region B, similarly to the semiconductor device 100e of FIG. 8.

The n type first gate structure 210a2 may include a gate insulating film 212a2, a lower metal gate electrode 214a2, a barrier metal film 216a2, and an upper metal gate electrode 218a2. A material or a method of forming the gate insulating film 212a2 is the same as that described with reference to the semiconductor device 200 of FIGS. 9 through 12.

The lower metal gate electrode 214a2 may be formed on the gate insulating film 212a2 to surround lower and side surfaces of the barrier metal film 216a2. A material, a function, and a construction of the lower metal gate electrode 214a2 are the same as those described with reference to the lower metal gate electrode 114a5 of the semiconductor device 100e of FIG. 8. However, the n type first gate structure 210a2 is formed to surround a part of upper and side surfaces of the fin 240a, and thus the lower metal gate electrode 214a2 may be also formed to surround the part of the upper and side surfaces of the fin 240a.

The barrier metal film 216a2 may be formed on the lower metal gate electrode 214a2 to surround lower and side surfaces of the upper metal gate electrode 218a2. Due to an entire structure of the n type first gate structure 210a2, the barrier metal film 216a2 may be formed to surround the part of the upper and side surfaces of the fin 240a. A material of the barrier metal film 216a2 is the same as that described with reference to the barrier metal film 116a5 of the semiconductor device 100e of FIG. 8.

The upper metal gate electrode 218a2 may be formed on the barrier metal film 216a2. The upper metal gate electrode 218a2 may correspond to the upper metal gate electrode 118a5 of the semiconductor device 100e of FIG. 8. Accordingly, the upper metal gate electrode 218a2 is the same as the upper metal gate electrode 118a5 of the semiconductor device 100e of FIG. 8, except that the upper metal gate electrode 218a2 may be formed to surround the part of the upper and side surfaces of the fin 240a.

The p type first gate structure 210a2-1 may include the gate insulating film 212a2, a lower metal gate electrode 214a2-1, and the barrier metal film 216a2. The p type first gate structure 210a2-1 may be generally the same as the p type first gate structure 110a5-1 of the semiconductor device 100e of FIG. 8. However, the p type first gate structure 210a2-1 may be different from the p type first gate structure 110a5-1 of the semiconductor device 100e of FIG. 8 in that the p type first gate structure 210a2-1 is also formed to surround the part of the upper and side surfaces of the fin 240a.

The second gate structure 210b2-1 may include a gate insulating film 212b2, a lower metal gate electrode 214b2-1, a barrier metal film 216b2, and an upper metal gate electrode 218b2. The second gate structure 210b2-1 may be generally the same as the second gate structure 110b5-1 of the semiconductor device 100e of FIG. 8. However, the second gate structure 210b2-1 may be also different from the second gate structure 110b5-1 of the semiconductor device 100e of FIG. 8 in that the second gate structure 210b2-1 is also formed to surround the part of the upper and side surfaces of the fin 240a.

In the semiconductor device 200b of example embodiments, although a material and a construction of the lower metal gate electrode 214b2-1 of the second gate structure 210b2-1 of the second region B are the same as those of the lower metal gate electrode 214a2-1 of the p type first gate structure 210a2-1, the material and the construction of the lower metal gate electrode 214b2-1 of the second gate structure 210b2-1 of the second region B may be the same as those of the lower metal gate electrode 214a2 of the n type first gate structure 210a2 according to functions. Only one p type first gate structure 210a2-1 is disposed in the first region A but the number of the n type first gate structure 210a2 and the p type first gate structure 210a2-1 is not limited thereto and may be adjusted in various ways. Furthermore, the n type first gate structure 210a2 and the p type first gate structure 210a2-1 may not be mixed in the first region A and only one channel type first gate structure may be disposed in the first region A.

In the semiconductor device 200b of example embodiments, the n and p type first gate structures 210a2 and 210a2-1 disposed in the first region A may have narrow widths and flat upper surfaces in the first direction (x direction), and the second gate structure 210b2-1 disposed in the second region B may have a broad width and a convex upper surface in the first direction (x direction). Meanwhile, widths of the n type first gate structure 210a2 and the p type first gate structure 210a2-1 in the first direction (x direction) may be the same in the first region A. However, one of the widths of the n type first gate structure 210a2 and the p type first gate structure 210a2-1 may be greater according to circumstances.

As described with reference to FIGS. 9 through 12 above, upper surfaces of the n type first gate structure 210a2, the p type first gate structure 210a2-1, the spacer 230a, and the interlayer insulating film 220a may have a same height and constitute one plane in the first region A, and upper surfaces of the second gate structure 210b2-1, the spacer 230b, and the interlayer insulating film 220b may have gentle inclines tapered toward a center potion of the interlayer insulating film 220b from a center portion of the second gate structure 210b2-1 in the second region B.

In connection with a semiconductor device including a fin, constructions similar to those of gate structures of the semiconductor devices 100a and 100e of FIGS. 4 and 8 are described above but the semiconductor device including the fin is not limited thereto. Constructions of gate structures of the semiconductor devices 100b, 100c, and 100d of FIGS. 5 through 7 may also be applied to the semiconductor device including the fin. Furthermore, if a gate structure has a narrow width and a flat upper surface in one region, and another gate structure has a broad width and a convex upper surface in another region, constructions of gate structures other than the above-described gate structures may also be applied to the semiconductor device including the fin.

Figure 16:
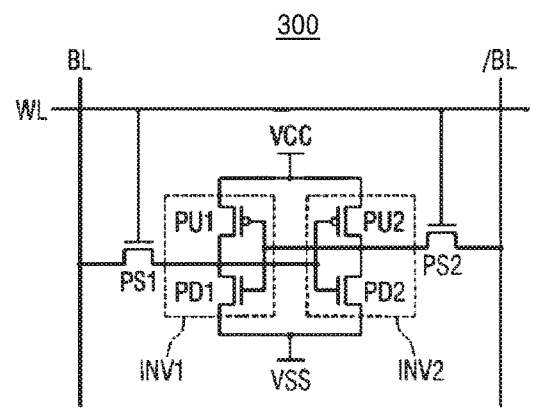
FIGS. 16 and 17 are circuit and layout diagrams, respectively, for describing a semiconductor device, according to example embodiments.
Figure 17:
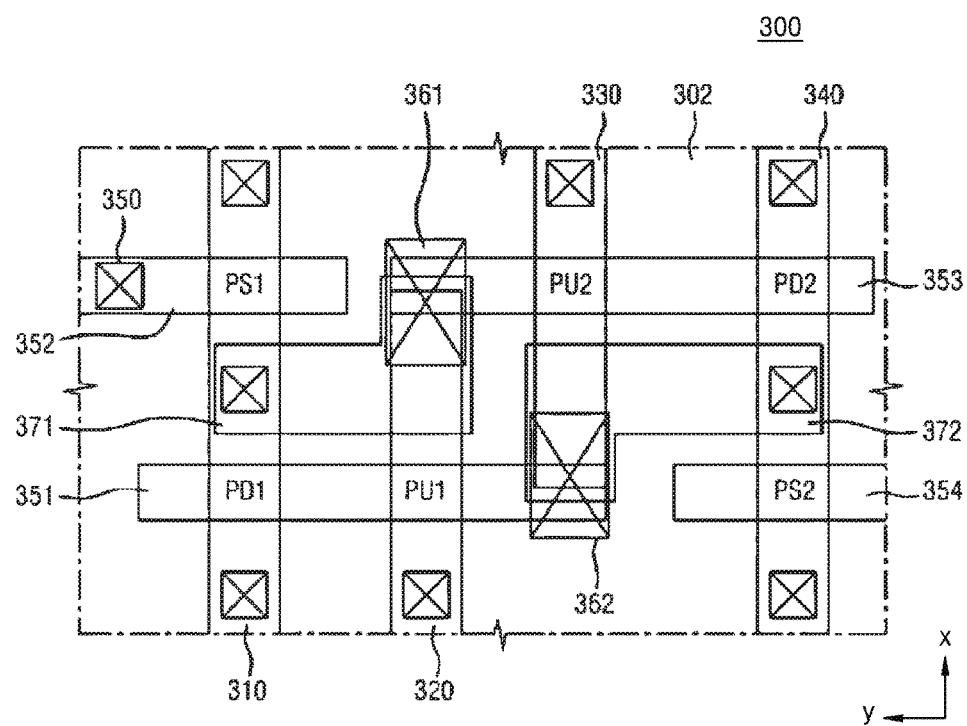

FIGS. 16 and 17 are circuit and layout diagrams, respectively, for describing a semiconductor device 300, according to example embodiments.

Referring to FIGS. 16 and 17, the semiconductor device 300 of example embodiments may include a pair of inverters INV1 and INV2 connected in parallel to each other between a power node Vcc and a ground node Vss and a first pass transistor PS1 and a second pass transistor PS2 that are connected to output nodes of the inverters INV1 and INV2, respectively. The first pass transistor PS1 and the second pass transistor PS2 may be respectively connected to a bit line BL and a complementary bit line BL/. Gates of the first pass transistor PS1 and the second pass transistor PS2 may be connected to a word line WL.

The first inverter INV1 may include a first pull-up transistor PU1 and a first pull-down transistor PD1 that are connected in serial to each other. The second inverter INV2 may include a second pull-up transistor PU2 and a second pull-down transistor PU2 that are connected in serial to each other. The first pull-up transistor PU1 and the second pull-up transistor PU2 may be PMOS transistors. The first pull-down transistor PD1 and the second pull-down transistor PU2 may be NMOS transistors.

To constitute one latch circuit, an input node of the first inverter INV1 may be connected to the output node of the second inverter INV2, and an input node of the second inverter INV2 may be connected to the output node of the first inverter INV1.

First through fourth active regions 310, 320, 330, and 340 that are spaced apart from each other may long extend in the first direction (x direction). Extension lengths of the second and third active regions 320 and 330 may be smaller than those of the first and fourth active regions 310 and 340.

First through fourth gate electrodes 351, 352, 353, and 354 may long extend in the second direction (y direction) and may cross the first and fourth active regions 310 and 340. In more detail, the first gate electrode 351 may cross the first active region 310 and the second active region 320 and may partially overlap with a longitudinal end of the third active region 330. The third gate electrode 353 may cross the third active region 330 and the fourth active region 340 and may partially overlap with a longitudinal end of the second active region 320. The second gate electrode 352 and the fourth gate electrode 354 may respectively cross the first active region 310 and the fourth active region 340.

As shown in FIGS. 16 and 17, the first pull-up transistor PU1 may be defined in a region in which the first gate electrode 351 and the second active region 320 cross each other, the first pull-down transistor PD1 may be defined in a region in which the first gate electrode 351 and the first active region 310 cross each other, and the first pass transistor PS1 may be defined in a region in which the second gate electrode 352 and the first active region 310 cross each other. The second pull-up transistor PU2 may be defined in a region in which the third gate electrode 353 and the third active region 330 cross each other, the second pull-down transistor PD2 may be defined in a region in which the third gate electrode 353 and the fourth active region 340 cross each other, and the second pass transistor PS2 may be defined in a region in which the fourth gate electrode 354 and the fourth active region 340 cross each other.

Although not clearly shown FIGS. 16 and 17, source/drain may be formed in both sides of regions in which the first through fourth gate electrodes 351, 352, 353, and 354 and the first through fourth active regions 310, 320, 330, and 340 cross each other. In addition, a shared contact 361 may simultaneously connect the second active region 320, the third gate electrode 353, and a wiring 371. The shared contact 362 may simultaneously connect the third active region 330, the first gate electrode 351, and a wiring 372.

For example, the semiconductor device 300 of example embodiments may correspond to SRAM. In this regard, the first through fourth gate electrodes 351, 352, 353, and 354 may correspond to one of gate structures formed in the first region A among the semiconductor devices 100, 100a, 100b, 100c, 100d, 100e, 200, 200a, and 200b of FIGS. 1 through 15. The first through fourth active regions 310, 320, 330, and 340 may correspond to active regions or fins formed in a semiconductor substrate of the first region A among the semiconductor devices 100, 100a, 100b, 100c, 100d, 100e, 200, 200a, and 200b of FIGS. 1 through 15. Although not shown, when a transistor is disposed in a peripheral region of the SRAM to apply power or ground, gate electrodes and active regions of the transistor may correspond to gate structures formed in the second region B and active regions or fins formed in a semiconductor substrate of the first region A among the semiconductor devices 100, 100a, 100b, 100c, 100d, 100e, 200, 200a, and 200b of FIGS. 1 through 15.

Figure 18:
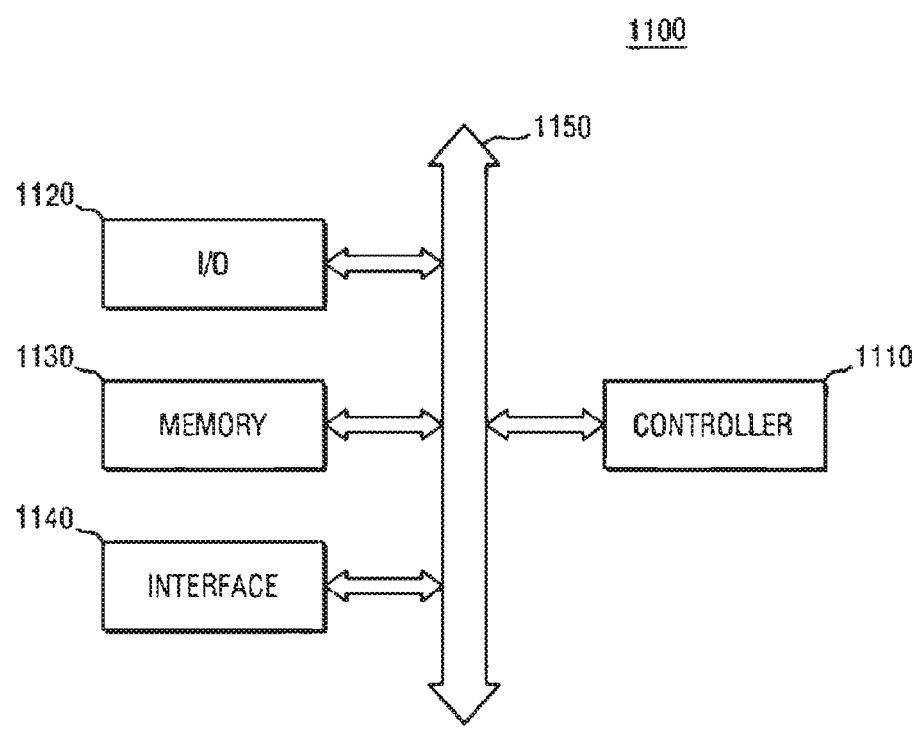
FIGS. 18 and 19 are block diagrams respectively illustrating electronic systems including semiconductor devices, according to example embodiments.
Figure 19:
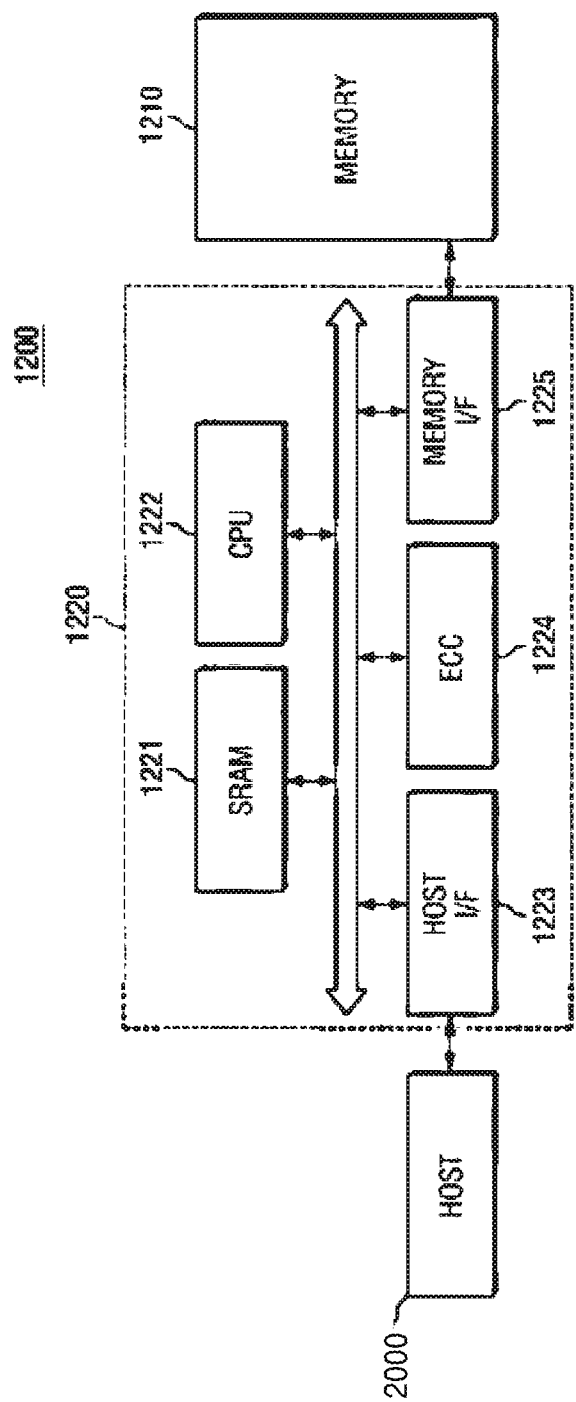

FIGS. 18 and 19 are block diagrams respectively illustrating electronic systems 1100 and 1200 including semiconductor devices, according to example embodiments.

Referring to FIG. 18, the electronic system 1100 according to example embodiments may include a controller 1110, an I/O device 1120, a memory 1130, an interface 1140, and a bus 1150. The controller 1110, the I/O device 1120, the memory 1130, and/or the interface 1140 may be connected to one another via the bus 1150. The bus 1150 may be a path through which data is transmitted between elements.

The controller 1110 may include at least one of a microprocessor, a digital signal processor, a microcontroller, and logic devices for performing similar functions thereto. The I/O device 1120 may include a keypad, a keyboard, and a display device. The memory 1130 may store data and/or commands. The interface 1140 may transmit data to a communication network or receive data from the communication network. The interface 1140 may be a wired interface or a wireless interface. For example, the interface 1140 may include an antenna or a wired/wireless transceiver.

Although not shown, the electronic system 1100 may further include relatively high speed DRAM and/or SRAM as operating memory for enhancing an operation of the controller 1110. At least one of the semiconductor devices 100, 100a, 100b, 100c, 100d, 100e, 200, 200a, and 200b of the example embodiments may be provided in one memory 1130 or as a part of the controller 1110 and/or the I/O device 1120.

The electronic system 1100 may be applied to a personal digital assistant (PDA), a portable computer, a web tablet, a wireless phone, a mobile phone, a digital music player, a memory card, or any electronic product for wirelessly transmitting and/or receiving information.

Referring to FIG. 19, the electronic system 1200 according to example embodiments may be a memory card. The electronic system 1200 may include a memory 1210 and a memory controller 1220. The memory controller 1220 may control a data exchange between a host 2000 and the memory 1210. The memory 1210 and memory controller 1220 may include at least one of the semiconductor devices 100, 100a, 100b, 100c, 100d, 100e, 200, 200a, and 200b of the example embodiments.

The memory controller 1220 may include SRAM 1221, a central processing unit (CPU) 1222, a host interface 1223, an error correction code (ECC) 1224, and a memory interface 1225. The SRAM 1221 may be used as operating memory of the CPU 1222. The host interface 1223 may include a protocol to allow a host 200 to connect to the electronic system 1200 and exchange data. The ECC 1224 may detect and correct an error of data read from memory 1210. The memory interface 1225 may interface with the memory 1210 to input and output the data. The CPU 1222 may perform overall control operations relating to a data exchange of a memory controller 1220.

Figure 20:
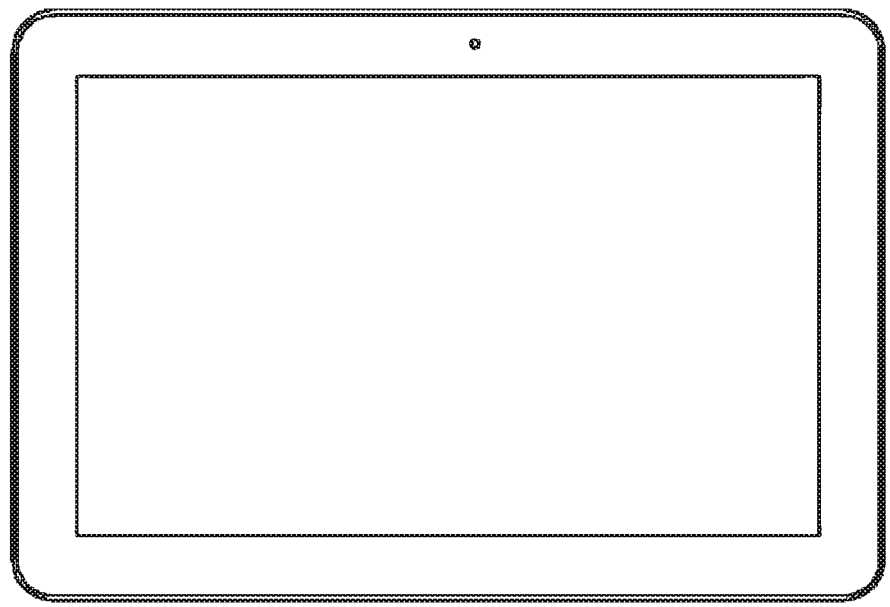
FIGS. 20 and 21 are schematic diagrams illustrating example electronic systems applicable to semiconductor devices, according to example embodiments.
Figure 21:
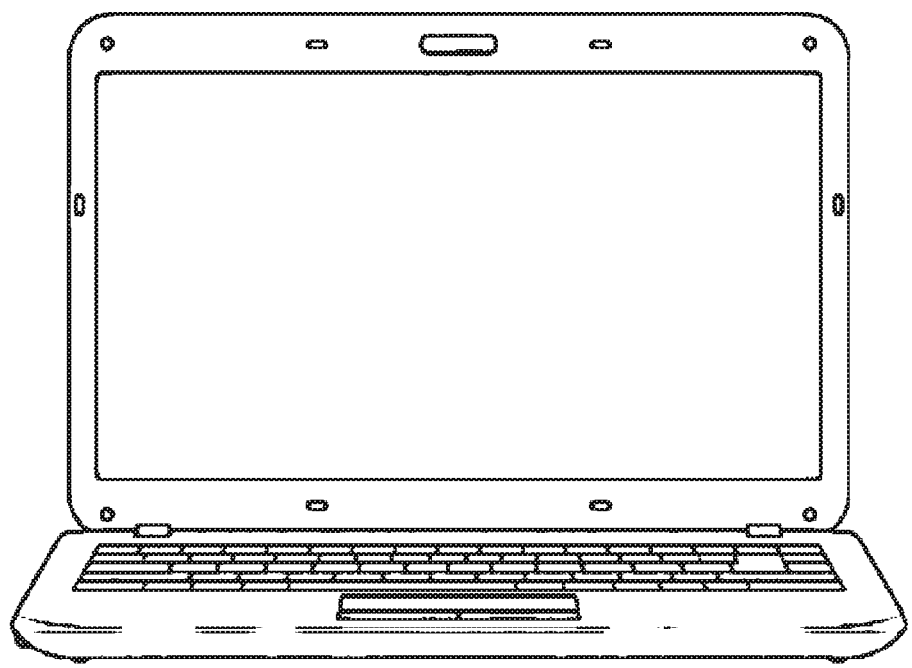

FIGS. 20 and 21 are schematic diagrams illustrating example electronic systems applicable to semiconductor devices, according to example embodiments.

FIGS. 20 and 21 respectively illustrate a tablet PCT and a notebook. At least one of the semiconductor devices 100, 100a, 100b, 100c, 100d, 100e, 200, 200a, and 200b of the example embodiments may be used in the tablet PC and/or the notebook. At least one of the semiconductor devices 100, 100a, 100b, 100c, 100d, 100e, 200, 200a, and 200b of the example embodiments may be applied to other electronic systems that are not illustrated.

FIGS. 22A through 22F are cross-sectional views for describing a method of manufacturing a semiconductor device of FIGS. 1 through 3, according to example embodiments. The description already made with reference to FIGS. 1 through 3 will be briefly given or omitted for convenience of description.

Figure 22A:
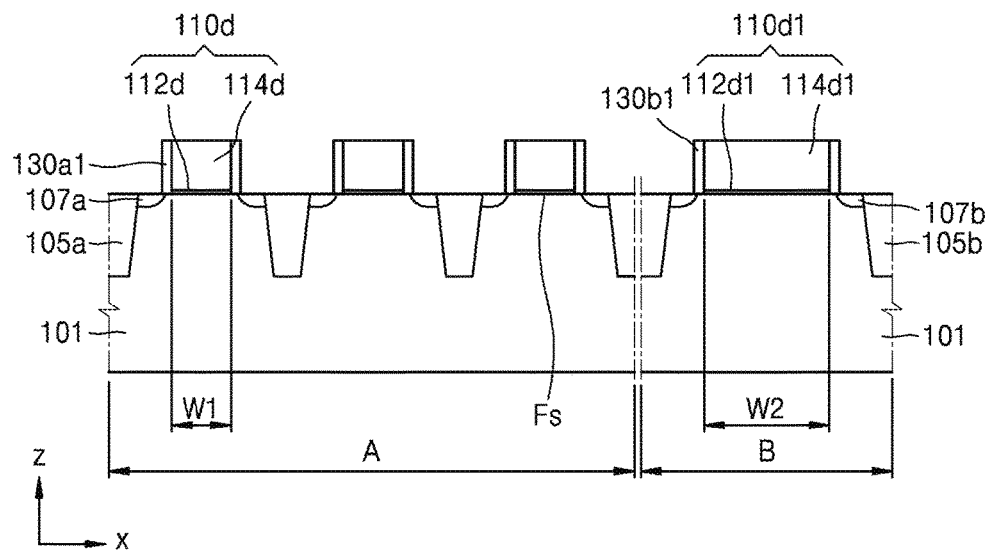
FIGS. 22A through 22F are cross-sectional views for describing a method of manufacturing the semiconductor device of FIGS. 1 through 3, according to example embodiments.

Referring to FIG. 22A, dummy gate structures 110d and 110d1 and spacers 130a1 and 130b1 may be formed on the semiconductor substrate 101.

In more detail, a sacrificing insulating film and a sacrificing gate film may be formed on the semiconductor substrate 101, the sacrificing insulating film and the sacrificing gate film may be patterned through a photolithography process, the first dummy gate structure 110d may be formed in the first region A, and the second dummy gate structure 110d1 may be formed in the second region B. The sacrificing insulating film may be formed of amorphous carbon layer (ACL) having a relatively great amount of carbon or C-SOH. The sacrificing gate film may be formed of polysilicon. However, materials of the sacrificing insulating film and the sacrificing gate film are not limited to those materials.

The first dummy gate structure 110d and the second dummy gate structure 110d1 may extend in a second direction (in a direction going out or into a surface of paper). The first dummy gate structure 110d may include a first dummy gate insulating film 112d and a first dummy gate electrode 114d. The second dummy gate structure 110d1 may include a second dummy gate insulating film 112d1 and a second dummy gate electrode 114d1.

The first dummy gate structure 110d or the first dummy gate electrode 114d in the first direction (x direction) may have the first width W1. The second dummy gate structure 110d1 or the second dummy gate electrode 114d1 in the first direction (x direction) may have the second width W2. For example, the first width W1 may be less than 80 nm, and the second width W2 may be more than 80 nm. Upon relatively comparing the first width D1 and the second width W2, the second width W2 may be more than 2 times the first width W1.

After forming the first dummy gate structure 110d and the second dummy gate structure 110d1, the spacers 130a1 and 130b1 may be formed on both side walls of each of the first dummy gate structure 110d and the second dummy gate structure 110d1. The spacers 130a1 and 130b1 may be formed by forming an insulating film that uniformly covers a resultant (not shown) on the semiconductor substrate 101, removing the insulating film from upper surfaces of the dummy gate electrodes 114d and 114d1 and the semiconductor substrate 101 through dry etch and/or etch-back, and remaining the insulating film on both side walls of the dummy gate electrodes 114d and 114d1. The spacers 130a1 and 130b1 may be formed as, for example, a silicon oxide film, a silicon nitride film, or a silicon oxynitride film.

After forming the spacers 130a1 and 130b1, an ion injection process may be performed by using the dummy gate structures 110d and 110d1 and the spacers 130a1 and 130b1 as a mask, thereby forming an impurity region on the semiconductor substrate 101, for example, source/drain regions 107a and 107b. Before forming the spacers 130a1 and 130b1, the ion injection process may be performed to form a lightly doped drain (LDD) region.

Figure 22B:
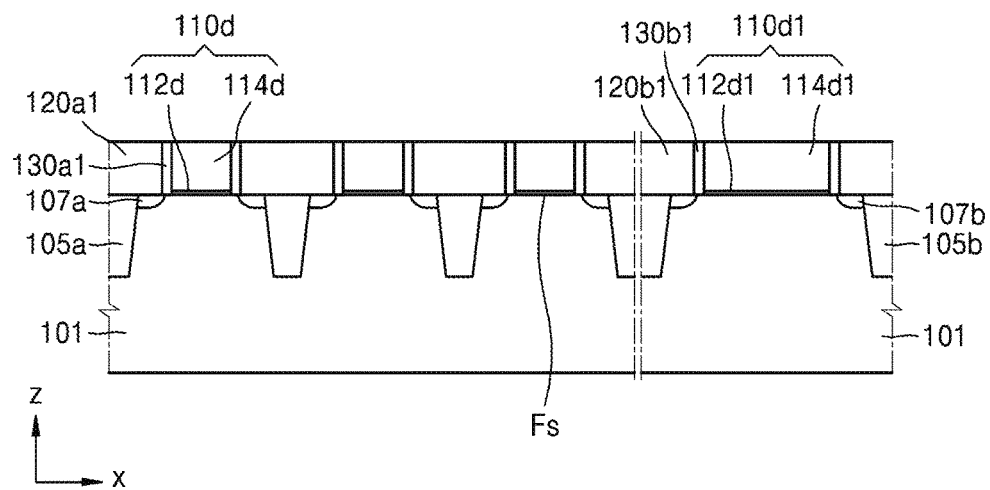

Referring to FIG. 22B, interlayer insulating films 120a1 and 120b1 may be formed by forming an insulating film covering the resultant on the semiconductor substrate 101 and planarizing the insulating film. The insulating film may be planarized through CMP. Upper surfaces of the dummy gate structures 110d and 110d1 may be exposed by planarizing the insulating film. The interlayer insulating films 120a1 and 120b1 may include at least one of the silicon oxide film, the silicon nitride film, the silicon oxynitride film, and a combination of these, and may be formed of a material having a different etch selectivity from that of the spacers 130a1 and 130b1.

Figure 22C:
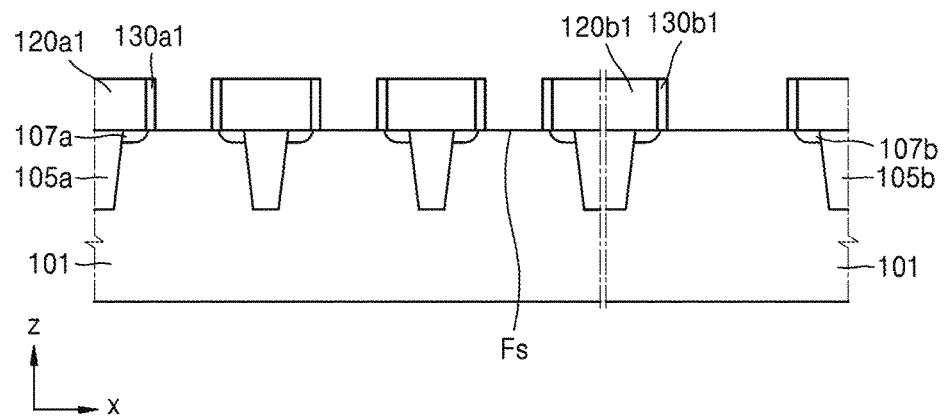

Referring to FIG. 22C, after forming the interlayer insulating films 120a1 and 120b1, the dummy gate structures 110d and 110d1 may be removed. The upper surface Fs of the semiconductor substrate 101 may be exposed by removing the dummy gate structures 110d and 110d1. The spacers 130a1 and 130b1 and the interlayer insulating films 120a1 and 120b1 may have an etch selectivity with respect to the dummy gate structures 110d and 110d1. Accordingly, the dummy gate structures 110d and 110d1 may be easily removed through, for example, wet etch. The dummy gate structures 110d and 110d1 may be removed by sequentially removing the dummy gate electrodes 114d and 114d1 and the dummy gate insulating films 112d and 112d1.

Figure 22D:
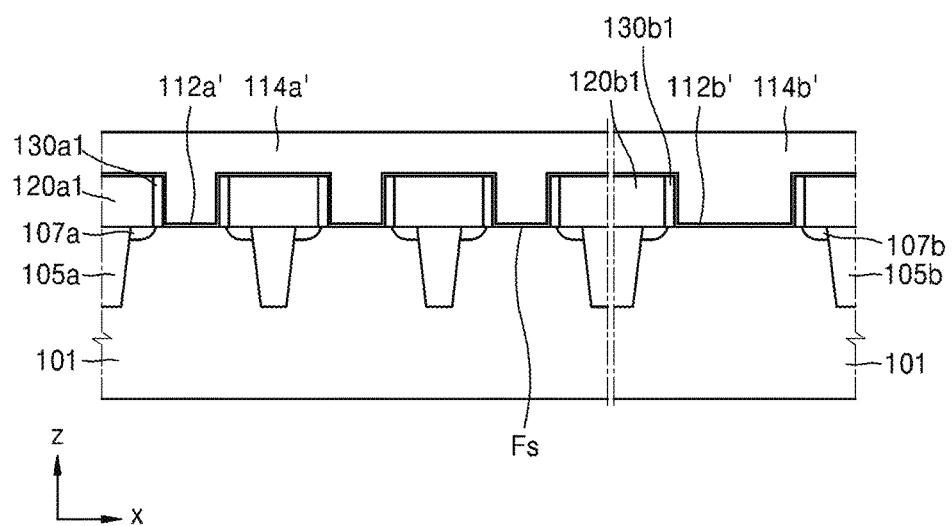

Referring to FIG. 22D, after removing the dummy gate structures 110d and 110d1, insulating films 112a' and 112b' for a gate insulating film and metal films 114a' and 114b' may be formed on the resultant on the semiconductor substrate 101. The insulating films 112a' and 112b' for the gate insulating film may be formed using the materials and methods of forming the gate insulating films 112a and 112b of the semiconductor device 100 of FIGS. 1 through 3. For example, the insulating films 112a' and 112b' for the gate insulating film may be formed of at least one selected from the group consisting of the silicon oxide film, the silicon nitride film, the silicon oxynitride film, ONO, and a high-k dielectric film having a higher dielectric constant than that of the silicon oxide film.

The metal films 114a' and 114b' may be formed using the materials and methods of forming the metal gate electrodes 114a and 114b of the semiconductor device 100 of FIGS. 1 through 3. The metal films 114a' and 114b' may be formed as one metal film but may include at least two metal films. For example, the metal films 114a' and 114b' may include a barrier metal film and an electrode metal film. The metal films 114a' and 114b' may include a work function adjusting film.

Figure 22E:
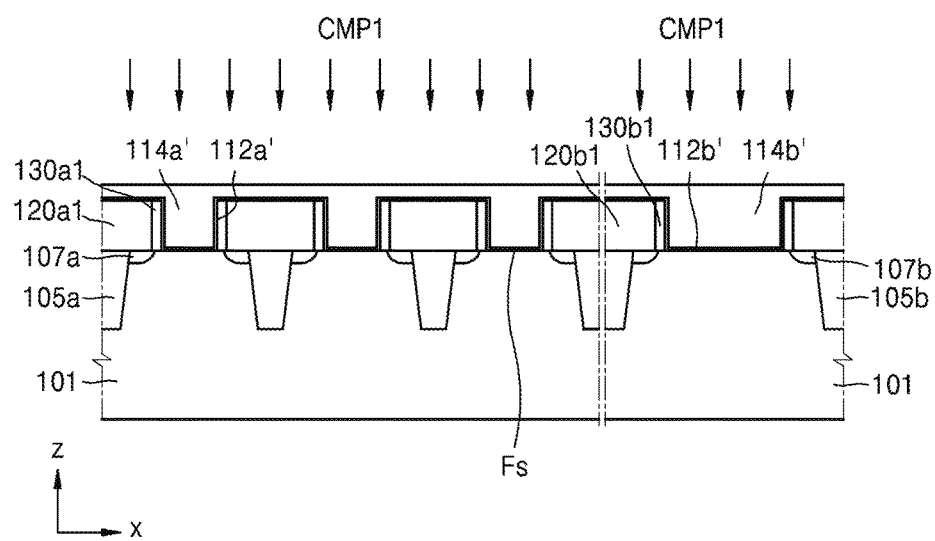

Referring to FIG. 22E, after forming the metal films 114a' and 114b', a first planarizing process may be performed. The first planarizing process may be performed through first CMP CMP1. The metal films 114a' and 114b' may be only removed during the first planarizing process. Thus, a polishing agent for etching only the metal films 114a' and 114b' may be used during the first planarizing process. In this case, the insulating films 112a' and 112b' may function as an etch prevention film during the first planarizing process.

In the first planarizing process, the metal films 114a' and 114b' are only removed, and thus an overall region may be uniformly etched at a same etch speed. Accordingly, an upper surface of a remaining resultant may have an almost same height after the first planarizing process. Although the insulating films 112a' and 112b' are not exposed in FIG. 22E, the insulating films 112a' and 112b' may be exposed after the first planarizing process.

Figure 22F:
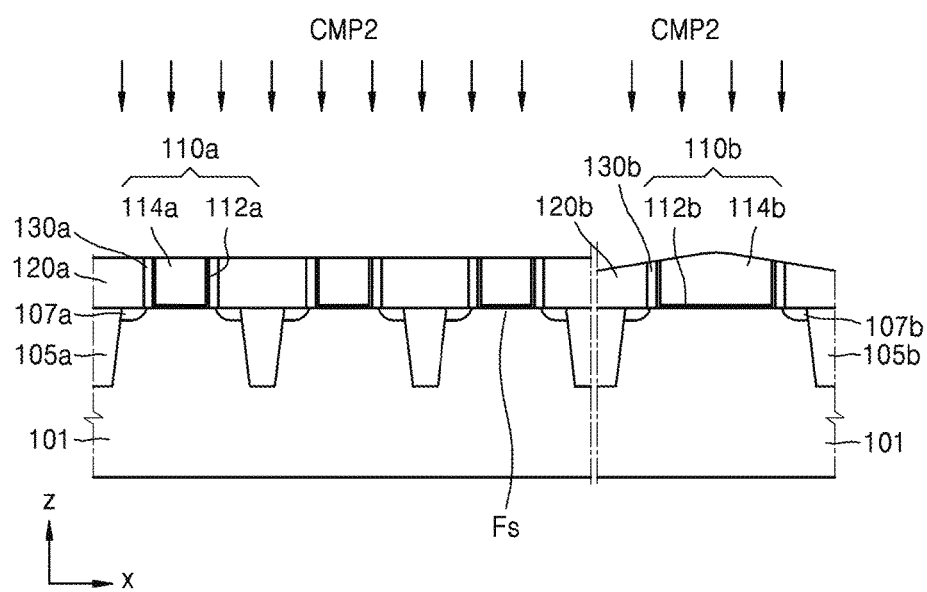

Referring to FIG. 22F, after the first planarizing process, a second planarizing process may be performed. The second planarizing process may be performed through second CMP CMP2. The second planarizing process may be performed until upper surfaces of the interlayer insulating films 120a and 120b are exposed. During the second planarizing process, not only the metal films 114a' and 114b' but also the insulating films 112a' and 112b' and upper portions of the interlayer insulating films 120a and 120b may be etched. Accordingly, during the second planarizing process, a polishing agent for commonly etching the metal films 114a' and 114b', the insulating films 112a' and 112b', and the interlayer insulating films 120a and 120b may be used.

Meanwhile, the second planarizing process is used to remove the insulating films 112a' and 112b' from the interlayer insulating films 120a and 120b, and thus a polishing agent having a faster etch speed with respect to the insulating films 112a' and 112b' and the interlayer insulating films 120a and 120b than with respect to the metal films 114a' and 114b' may be generally used. Accordingly, during the second planarizing process, an etch speed with respect to the metal films 114a' and 114b' may be slower than that with respect to the insulating films 112a' and 112b' and the interlayer insulating films 120a and 120b.

During the second planarizing process, due to a difference between the etch speed with respect to the metal films 114a' and 114b' and the etch speed with respect to the insulating films 112a' and 112b' and the interlayer insulating films 120a and 120b, a construction of the gate structure 110a of the first region A may be different from that of the gate structure 110b of the second region B. That is, the gate structures 110a have narrow widths in the first direction (x direction) and small spaces therebetween in the first region A, and thus the gate structures 110a and the interlayer insulating films 120a may have flat upper surfaces in spite of the difference in the etch speed.

In the meantime, the gate structures 110b have broad widths in the first direction (x direction) and the interlayer insulating films 120b formed in both sides of the gate structures 110b have also broad widths in the first direction (x direction) in the second region B, and thus the difference in the etch speed may be reflected on the gate structures 110b and the interlayer insulating films 120b. Thus, the gate structure 110b may be etched less than the interlayer insulating film 120b. Upper spaces of the gate structure 110b and the interlayer insulating film 120b may be smoothly connected together with an upper surface of the spacer 130b. Accordingly, as shown, the upper surface of the gate structure 110b in the second region B may be the highest in a center portion and may be lower toward an edge portion, and the upper surface of the interlayer insulating film 120b in the second region B may be the highest in an edge portion adjacent to the gate structure 110b and may be lower toward a center portion.

Meanwhile, the first planarizing process and the second planarizing process may use a same polishing agent. In this case, a polishing agent having a characteristic described with respect to the second planarizing process may be commonly used. Accordingly, after the second planarizing process, a construction of the gate structure 110a of the first region A and a construction of the gate structure 110b of the second region B may be different.

Figure 23A:
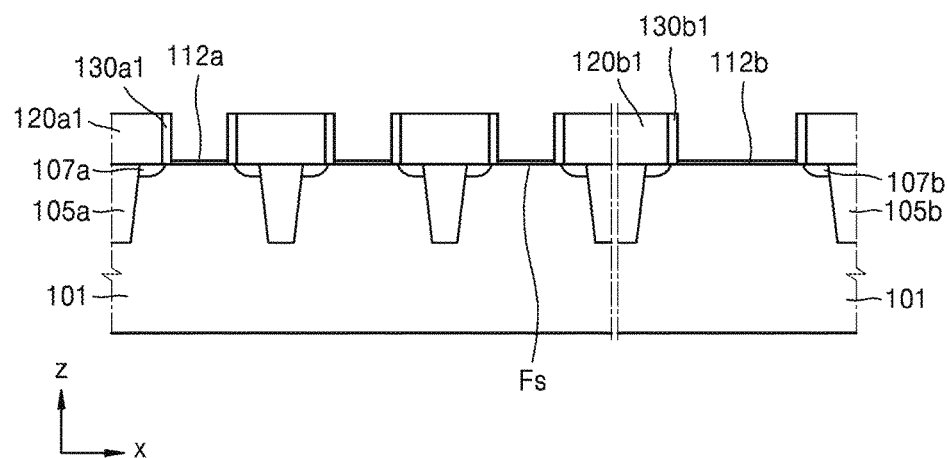
FIGS. 23A and 23B are cross-sectional views for describing a method of manufacturing the semiconductor device of FIG. 4, according to example embodiments.
Figure 23B:
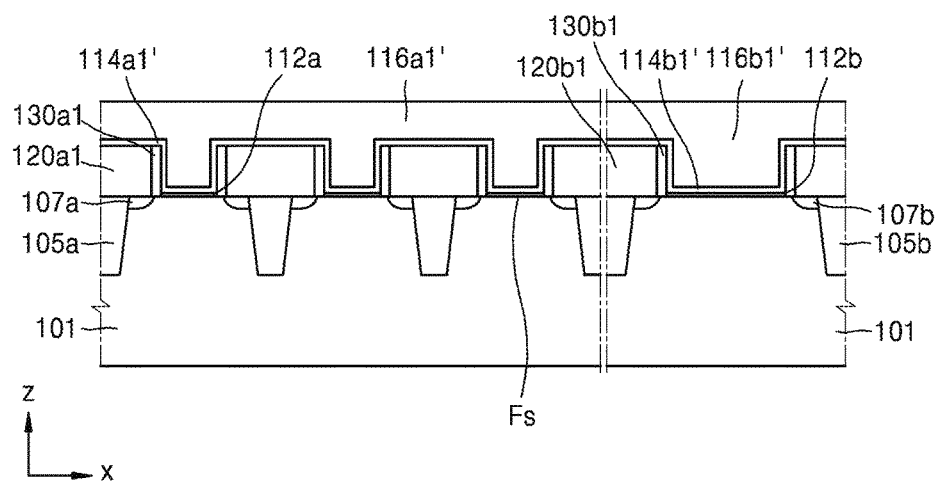

FIGS. 23A and 23B are cross-sectional views for describing a method of manufacturing a semiconductor device of FIG. 4, according to example embodiments. FIG. 23A may correspond to FIG. 22C. FIG. 23B may correspond to FIG. 22D. The description already made with reference to FIGS. 4 and 22A through 22F will be briefly given or omitted for convenience of description.

Referring to FIG. 23A, a dummy gate electrode may be removed after forming the interlayer insulating films 120a1 and 120b1 as described with reference to FIG. 22B. However, unlike as described with reference to FIG. 22C, the insulating films 112a and 112b formed in a lower portion of the dummy gate electrode may not be removed but remain. The insulating films 112a and 112b that are not removed may be used as gate insulating films later.

In more detail, when the dummy gate structures 110d and 110d1 are formed in FIG. 22A, insulating films for a gate insulating film may be formed instead of a sacrificing insulating film. Accordingly, the insulating films for the gate insulating film may be formed of the same material as that of the gate insulating films 120a and 120b of the semiconductor device 100 of FIGS. 1 through 3. After forming the insulating films for the gate insulating film, a dummy gate film may be formed, and the dummy gate structures 110d and 110d1 may be formed through patterning. The dummy gate film may be formed of polysilicon as described with reference to FIG. 22A.

Referring to FIG. 23B, after removing the dummy gate electrode, lower metal films 114a1' and 114b1' and upper metal films 116a1' and 116b1' may be sequentially formed on a resultant of the semiconductor substrate 101. Materials or methods of forming the lower metal films 114a1' and 114b1' are the same as those of the lower metal gate electrodes 114a1 and 114b1 of the semiconductor device 100a of FIG. 4. Materials or methods of forming the upper metal films 116a1' and 116b1' are the same as those of the upper metal gate electrodes 116a1 and 116b1 of the semiconductor device 100a of FIG. 4.

Thereafter, the semiconductor device 100a of FIG. 4 may be manufactured by performing first and second planarizing processes as described with reference to FIGS. 22E and 22F.

FIGS. 24A through 24D are cross-sectional views for describing a method of manufacturing a semiconductor device of FIG. 8, according to example embodiments. The description already made with reference to FIGS. 8 and 22A through 22F will be briefly given or omitted for convenience of description.

Figure 24A:
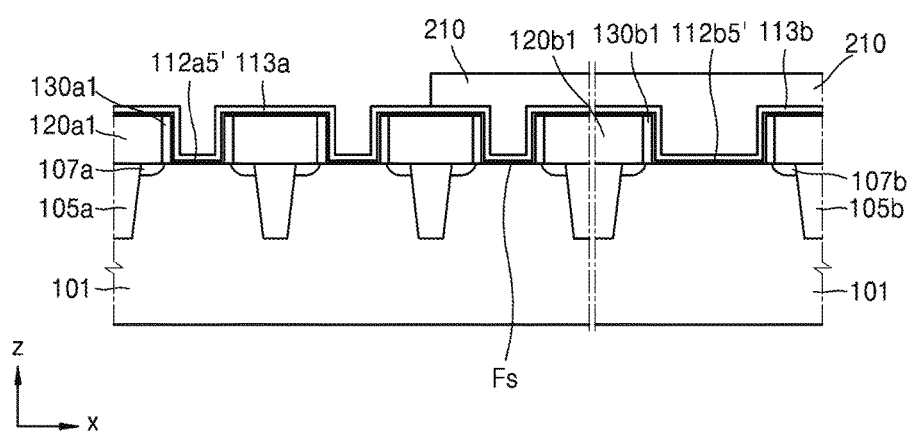
FIGS. 24A through 24D are cross-sectional views for describing a method of manufacturing the semiconductor device of FIG. 8, according to example embodiments.

Referring to FIG. 24A, after removing the dummy gate structures 110d and 110d1 through a process of FIGS. 22A through 22C, insulating films 112a5' and 112b5' for the gate insulating film and first lower metal films 113a and 113b may be sequentially formed. The insulating films 112a5' and 112b5' for the gate insulating film may correspond to the gate insulating films 112a5 and 112b5 of the semiconductor device 100e of FIG. 8, and thus materials or methods of forming the insulating films 112a5' and 112b5' for the gate insulating film are the same as those of the gate insulating films 112a5 and 112b5 of the semiconductor device 100e of FIG. 8. Meanwhile, the first lower metal films 113a and 113b may correspond to a part of the lower metal gate electrode 114a5-1 of the p type first gate structure 110a5-1 of the semiconductor device 100e of FIG. 8. For example, the first lower metal films 113a and 113b may function as a p type work function adjusting film.

After forming the first lower metal films 113a and 113b, a mask layer 210 covering the second region B and a portion in which a p type first gate structure is to be formed in the first region A may be formed. If a second gate structure of the second region B is formed as an n type, the mask layer 210 may not be formed on the second region B. The mask layer 210 may be formed of photoresist (PR) or formed of an extra material layer through PR patterning.

Figure 24B:
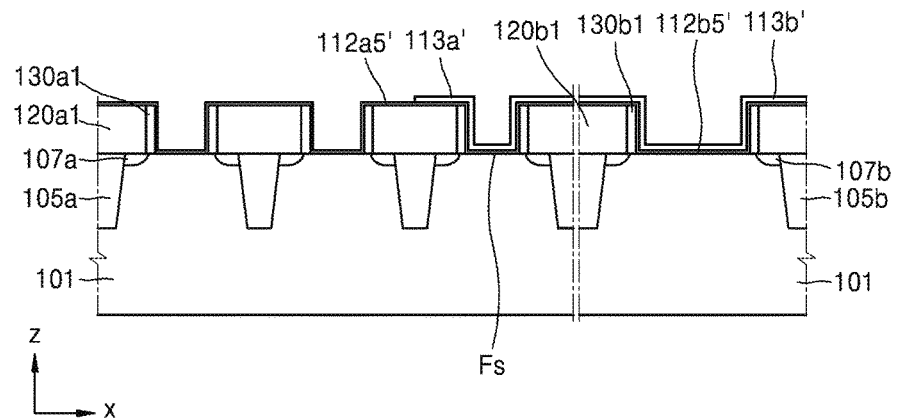

Referring to FIG. 24B, a portion of the first lower metal film 113a exposed in the first region A may be removed by using the mask layer 210 as an etch mask. In more detail, a portion of the first lower metal film 113a corresponding to a portion in which an n type first gate structure is to be formed may be removed. After removing a part of the first lower metal film 113a of the first region A, the mask layer 210 may be removed. By removing the mask layer 210, it may be seen that first lower metal films 113a' and 113b' on the second region B and the portion in which the p type first gate structure is formed in the first region A remain.

Figure 24C:
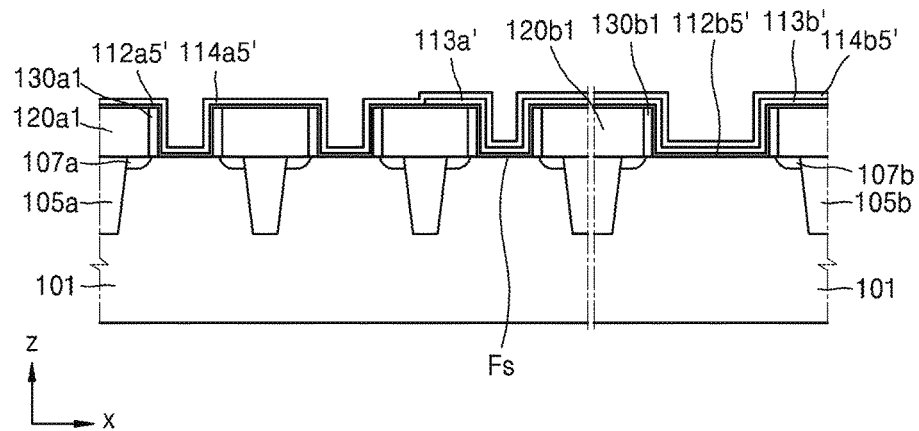

Referring to FIG. 24C, after removing a part of the first lower metal film 113a, second lower metal films 114a5' and 114b5' may be formed on a resultant of the semiconductor substrate 101. The second lower metal film 114a5' of a portion corresponding to the n type first gate structure of the first region A may constitute the lower metal gate electrode 114a5 of the semiconductor device 100e of FIG. 8. The second lower metal films 114a5' of the portion corresponding to the p type first gate structure of the first region A and the second lower metal films 114b5' of the second region B, with the first lower metal films 113a' and 113b', may constitute the lower metal gate electrodes 114a5-1 and 114b5-1 of the semiconductor device 100e of FIG. 8. Thus, materials or methods of forming the second lower metal films 114a5' and 114b5' may be the same as those of the lower metal gate electrodes 114a5, 114a5-1, and 114b5-1 of the semiconductor device 100e of FIG. 8. The second lower metal film 114a5' may function as a common work function adjusting film in the first region A.

The first lower metal films 113a' and the second lower metal films 114a5' of the portion corresponding to the p type first gate structure of the first region A, and the first lower metal films 113b' and the second lower metal films 114b5' of the second region B will be illustrated as one single film and referred to as united second lower metal films 114a5-1' and 114b5-1' below.

Figure 24D:
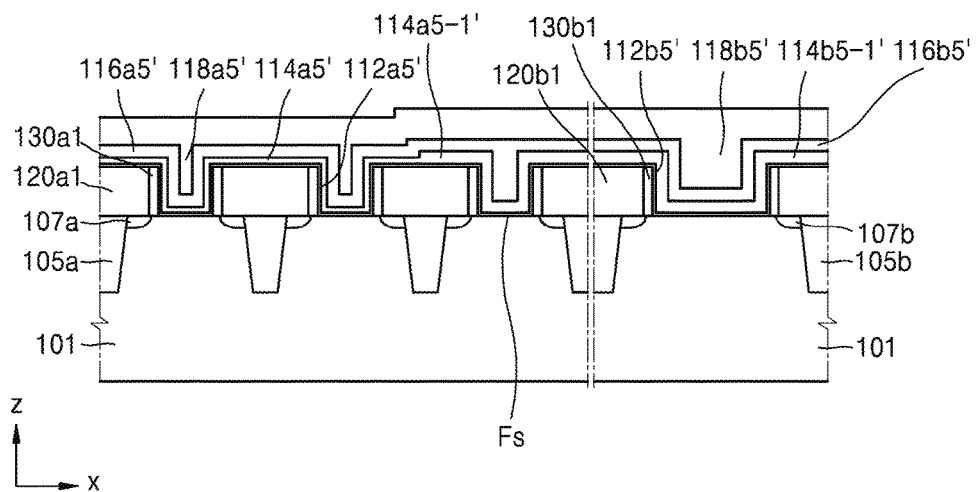

Referring to FIG. 24D. after forming the second lower metal films 114a5' and 114b5', metal films 116a5' and 116b5' for a barrier metal film and upper metal films 118a5' and 118b5' may be sequentially formed on the resultant of the semiconductor substrate 101. The metal films 116a5' and 116b5' for the barrier metal film may correspond to the barrier metal films 116a5 and 116b5 of the semiconductor device 100e of FIG. 8. The upper metal films 118a5' and 118b5' may correspond to the upper metal gate electrodes 118a5 and 118b5 of the semiconductor device 100e of FIG. 8. Accordingly, materials or methods of forming the metal films 116a5' and 116b5' for the barrier metal film and the upper metal films 118a5' and 118b5' are the same as those of the barrier metal films 116a5 and 116b5 and the upper metal films 118a5 and 118b5 of the semiconductor device 100e of FIG. 8.

Meanwhile, the united second lower metal film 114a5-1' may be formed in the portion corresponding to the p type first gate structure of the first region A and may be thicker than the second lower metal film 114a5'. Accordingly, only the metal film 116a5' for the barrier metal film may be formed on the united second lower metal film 114a5-1' in a trench in the portion corresponding to the p type first gate structure of the first region. In other words, the upper metal film 118a5' may not be formed in the trench.

Thereafter, the semiconductor device 100e of FIG. 8 may be manufactured by performing first and second planarizing processes as described with reference to FIGS. 22E and 22F.

FIGS. 25A through 25G and FIGS. 26A through 26G are cross-sectional views for describing a method of manufacturing a semiconductor device of FIGS. 9 through 12, according to example embodiments. FIGS. 25A through 25G are cross-sectional views corresponding to the cross-sectional view taken along line II-II' of the semiconductor device of FIG. 9. FIGS. 26A through 26G are cross-sectional views corresponding to the cross-sectional view taken along lines III-III' and IV-IV' of the semiconductor device of FIG. 9. The descriptions already made with reference to FIGS. 9 through 12 and FIGS. 22A through 22F will be briefly given or omitted for convenience of description.

Figure 26A:
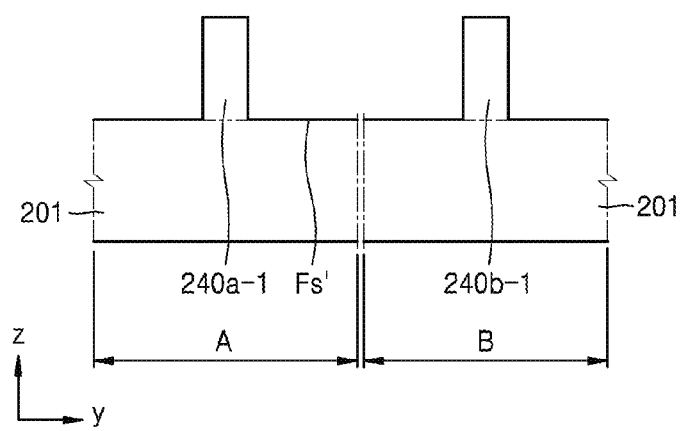
FIGS. 26A through 26G are cross-sectional views for describing a method of manufacturing the semiconductor device of FIGS. 9 through 12, corresponding to the cross-sectional view taken along the lines III-III' and IV-IV' of the semiconductor device of FIG. 9, according to example embodiments.

Referring to FIG. 26A, the first lower fin 240a-1 may be formed in the first region A and the second lower fin 240b-1 may be formed in the second region B by etching an upper portion of the semiconductor substrate 201. The first and second lower fins 240a-1 and 240b-1 may extend in a first direction (in a direction going out or into a surface of paper) on the semiconductor substrate 201. Descriptions of the semiconductor substrate 201 and the first and second lower fins 240a-1 and 240b-1 are the same as those of the semiconductor device 200 of FIGS. 9 through 12.

Figure 26B:
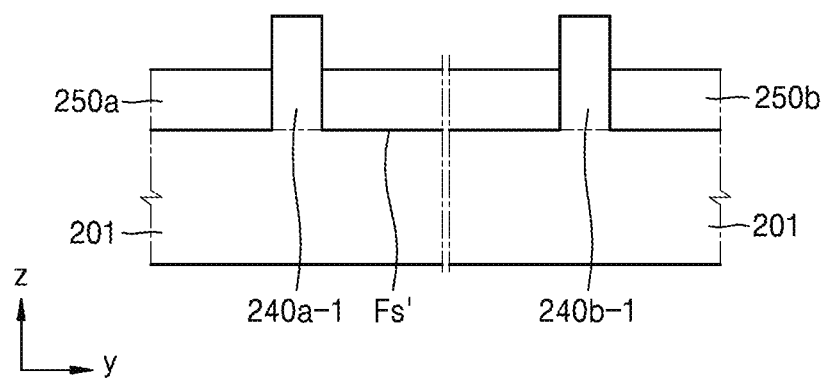

Referring to FIG. 26B, after forming the first and second lower fins 240a-1 and 240b-1, the first device isolation film 250a covering lower portions of both side surfaces of the first lower fin 240a-1 and the second device isolation film 250b covering lower portions of both side surfaces of the second lower fin 240b-1 may be formed. The first and second device isolation film 250a and 250b are formed as described above, and thus upper portions of the first and second lower fins 240a-1 and 240b-1 may protrude from the first and second device isolation film 250a and 250b.

The first and second device isolation film 250a and 250b may be formed by forming and planarizing an insulating film covering a resultant of the semiconductor substrate 201 and removing upper portions of the first and second device isolation film 250a and 250b such that the upper portions of the first and second lower fins 240a-1 and 240b-1 may protrude. Descriptions of materials of the first and second device isolation film 250a and 250b are the same as those of the semiconductor device 200 of FIGS. 9 through 12.

Figure 25A:
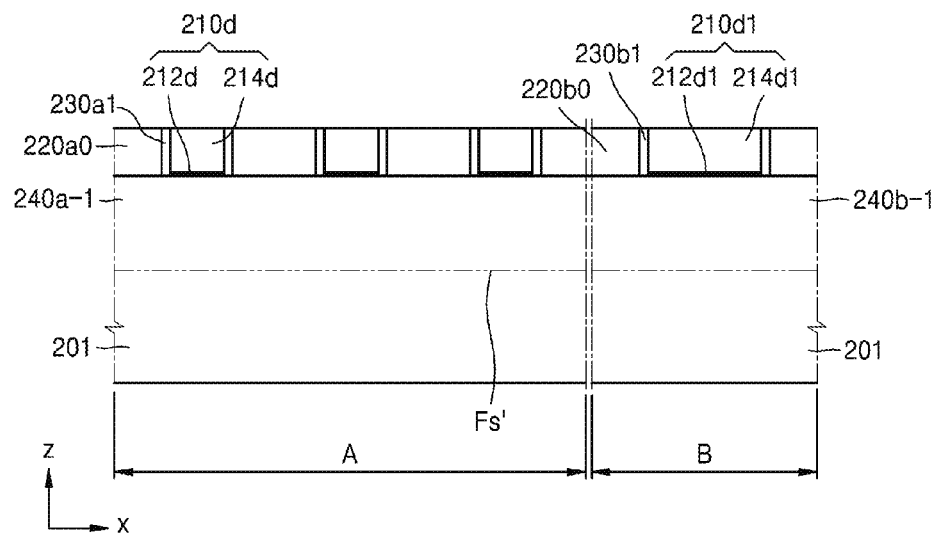
FIGS. 25A through 25G are cross-sectional views for describing a method of manufacturing the semiconductor device of FIGS. 9 through 12, corresponding to the cross-sectional view taken along the line II-II' of the semiconductor device of FIG. 9, according to example embodiments.
Figure 26C:
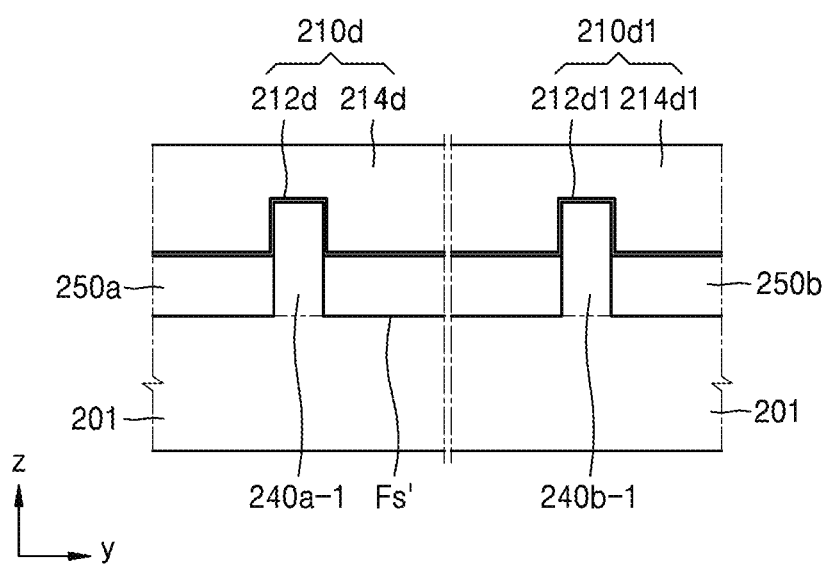

Referring to FIGS. 25A and 26C, after forming the first and second device isolation film 250a and 250b, dummy gate structures 210d and 210d1 may be formed, and first interlayer insulating films 220a0 and 220b0 may be formed in both side surfaces of the dummy gate structures 210d and 210d1. A process of forming the dummy gate structures 210d and 210d1 and the first interlayer insulating films 220a0 and 220b0 is the same as described with reference to FIGS. 22A and 22B. However, the first and second device isolation film 250a and 250b surrounding lower portions of both side surfaces of the first and second lower fins 240a-1 and 240b-1 are formed, and thus the dummy gate structures 210d and 210d1 and the first interlayer insulating films 220a0 and 220b0 may surround upper and side surfaces of the first and second lower fins 240a-1 and 240b-1 on the first and second device isolation film 250aand 250b.

Meanwhile, the dummy gate structures 210d and 210d1 may extend, for example, in the second direction (y direction). Spacers 230a1 and 230b1 may be formed between the dummy gate structures 210d and 210d1 and the first interlayer insulating films 220a0 and 220b0.

Figure 25B:
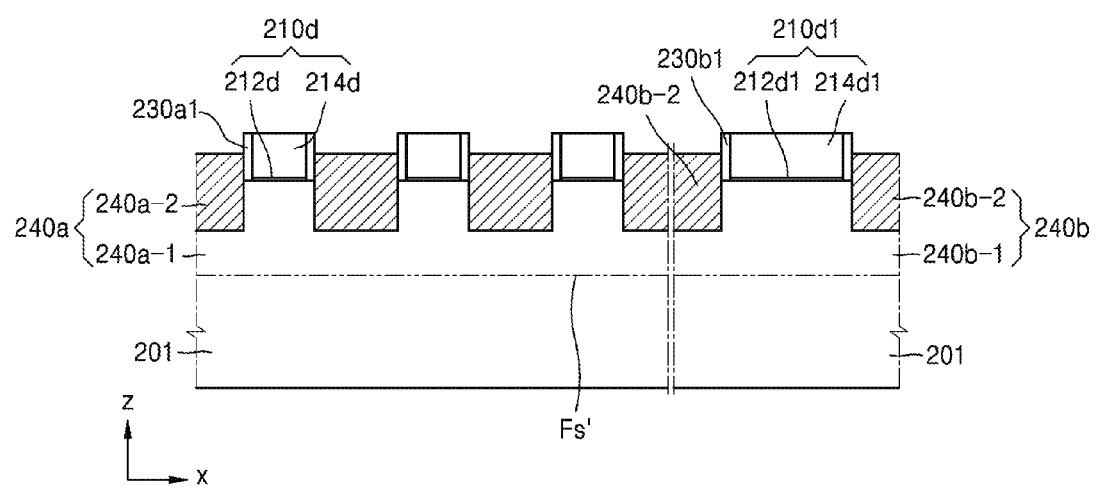

Referring to FIG. 25B, the first interlayer insulating films 220a0 and 220b0 may be removed by using the dummy gate structures 210d and 210d1 and the spacers 230a1 and 230b1 as a mask. Upper portions of the first and second lower fins 240a-1 and 240b-1 exposed by the first interlayer insulating films 220a0 and 220b0 may also be removed. Portions of the first and second lower fins 240a-1 and 240b-1 up to locations corresponding to upper surfaces of the first and second device isolation film 250a and 250b may be removed.

Thereafter, first and second upper fins 240a-2 and 240b-2 may be formed by growing an epitaxial layer from the remaining first and second lower fins 240a-1 and 240b-1. The first lower fin 240a-1 and the first upper fin 240a-2 may constitute the first fin 240a in the first region A. The second lower fin 240b-1 and the second upper fin 240b-2 may constitute the second fin 240b in the second region B.

As shown, upper surfaces of the first and second upper fins 240a-2 and 240b-2 may be higher than those of the first and second lower fins 240a-1 and 240b-1 of the lower portions of the dummy gate structures 210d and 210d1. The first and second upper fins 240a-2 and 240b-2 may cover a part of lower potions of the spacers 230a1 and 230b1.

Figure 25C:
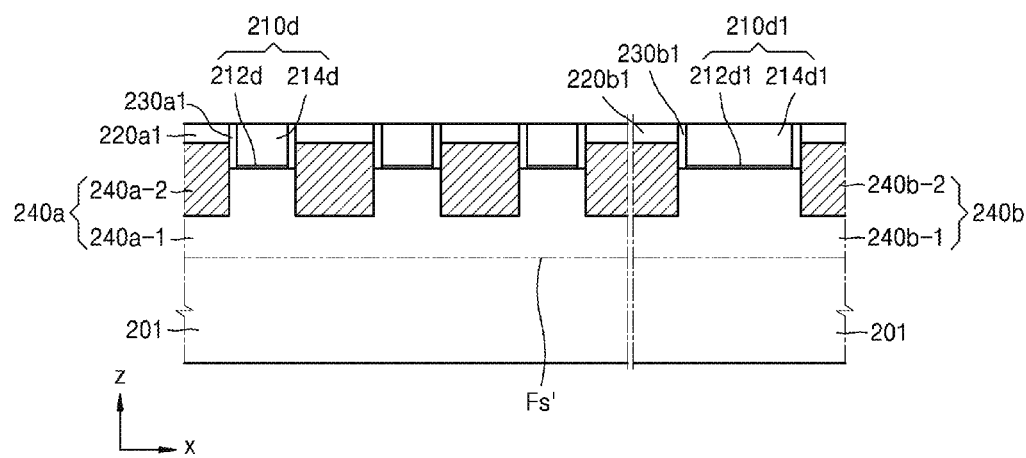

Referring to FIG. 25C, after forming the first and second upper fins 240a-2 and 240b-2, second interlayer insulating films 220a1 and 220b1 may be formed by forming and planarizing an insulating film covering the resultant of the semiconductor substrate 201. The second interlayer insulating films 220a1 and 220b1 may correspond to the second interlayer insulating films 220a and 220b of the semiconductor device 200 of FIGS. 9 through 12. Accordingly, materials of the second interlayer insulating films 220a1 and 220b1 may be the same as those of the second interlayer insulating films 220a and 220b of the semiconductor device 200 of FIGS. 9 through 12.

Figure 25D:
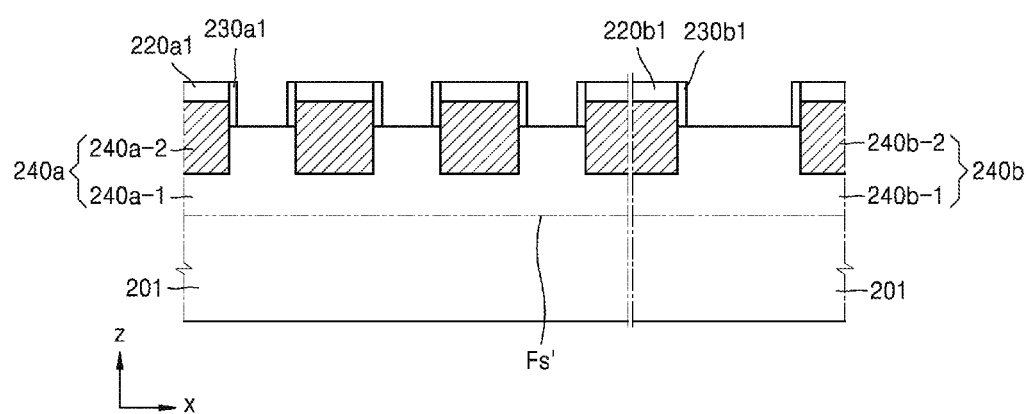
Figure 26D:
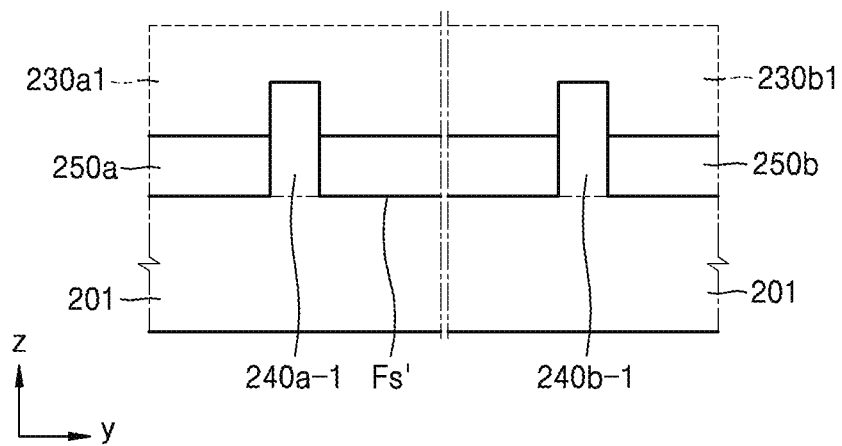

Referring to FIGS. 25D and 26D, after forming the second interlayer insulating films 220a1 and 220b1, the dummy gate structures 210d and 210d1 may be removed as described with reference to FIG. 22C. As shown in FIG. 26D, a part of upper and side surfaces of the first and second lower fins 240a-1 and 240b-1 may be exposed by removing the dummy gate structures 210d and 210d1.

In addition, although not shown in FIG. 26D, after removing the dummy gate structures 210d and 210d1, the spacers 230a1 and 230b1 may be seen as the outside of the upper and side surfaces of the first and second lower fins 240a-1 and 240b-1.

Figure 25E:
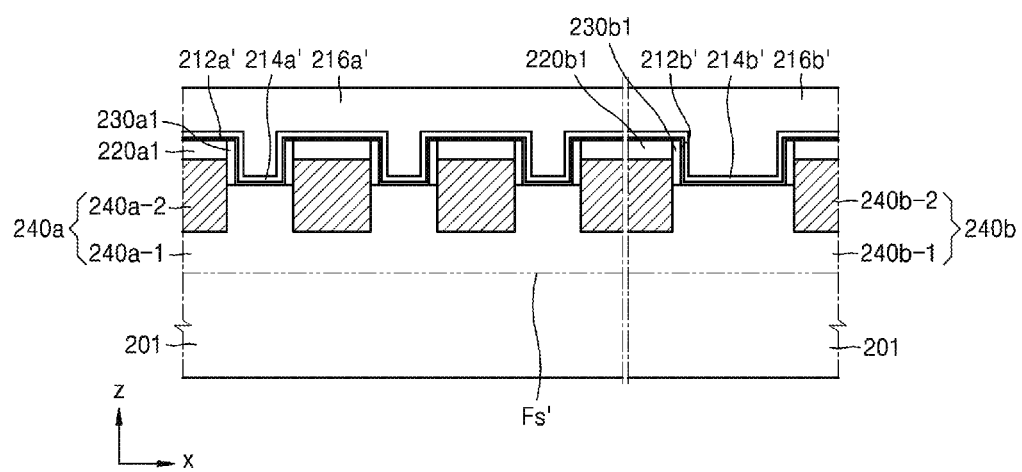
Figure 26E:
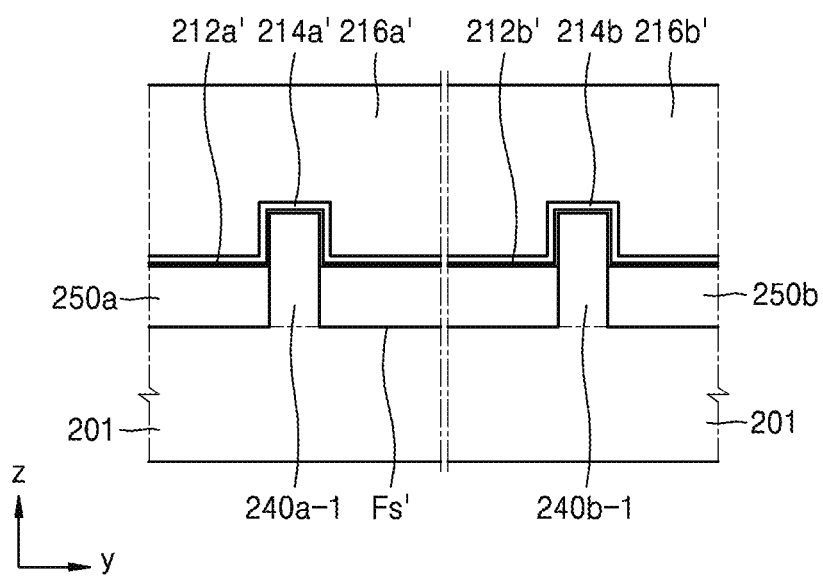

Referring to FIGS. 25E and 26E, after removing the dummy gate structures 210d and 210d1, insulating films 212a' and 212b' for a gate insulating film, lower metal films 214a' and 214b', and upper metal films 216a' and 216b' may be sequentially formed on the resultant of the semiconductor substrate 201. The insulating films 212a' and 212b' for the gate insulating film, the lower metal films 214a' and 214b', and the upper metal films 216a' and 216b' may respectively correspond to the gate insulating films 212a and 212b, the lower metal gate electrodes 214a and 214b, and the upper metal gate electrodes 216a and 216b of the semiconductor device 200 of FIGS. 9 through 12. Accordingly, materials or functions of the insulating films 212a' and 212b' for the gate insulating film, the lower metal films 214a' and 214b', and the upper metal films 216a' and 216b' are the same as described with reference to the semiconductor device 200 of FIG. 9.

Figure 25F:
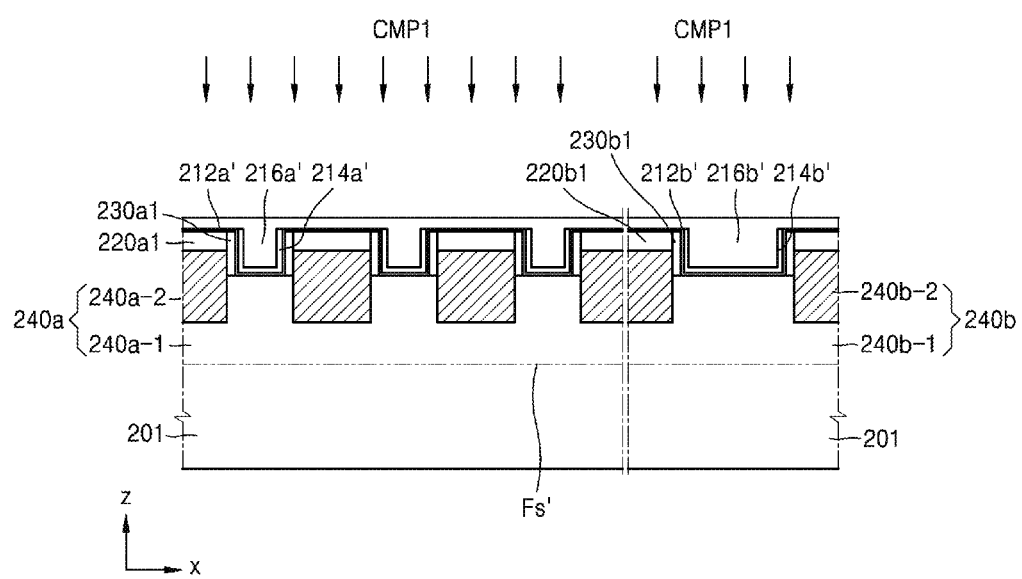
Figure 26F:
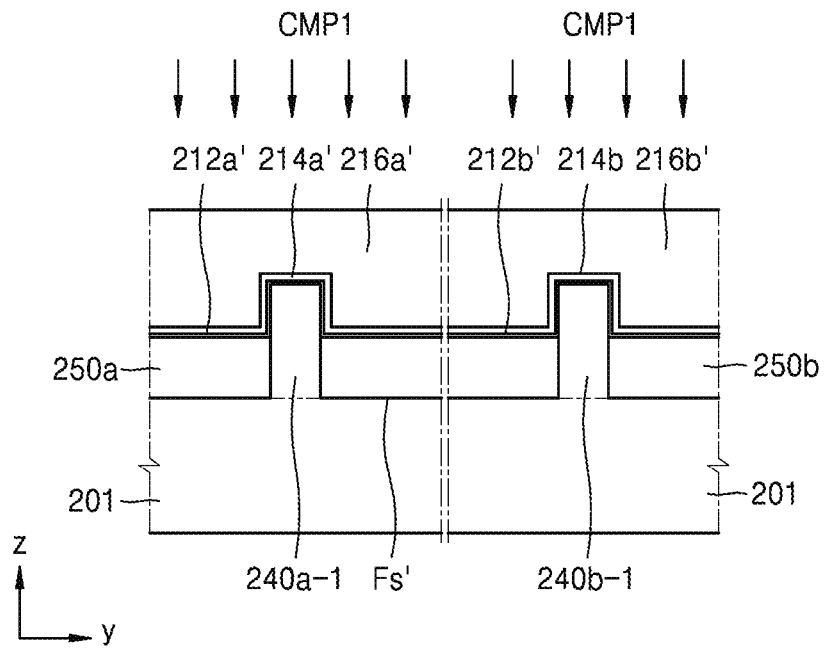

Referring to FIGS. 25F and 26F, after forming the insulating films 212a' and 212b' for the gate insulating film, the lower metal films 214a' and 214b', and the upper metal films 216a' and 216b', a first planarizing process may be performed. The first planarizing process may be performed through the first CMP CMP1. The first planarizing process may be similar to the first planarizing process described with reference to FIG. 22E. In more detail, during the first planarizing process, a polishing agent for etching only the lower metal films 214a' and 214b' and the upper metal films 216a' and 216b' may be used. The insulating films 212a' and 212b' for the gate insulating film may function as an etch prevention film during the first planarizing process.

In the first planarizing process, only the lower metal films 214a' and 214b' and the upper metal films 216a' and 216b' may be etched, and thus an overall region may be uniformly etched at a same etch speed. Accordingly, an upper surface of a remaining resultant may have an almost same height after the first planarizing process.

Figure 25G:
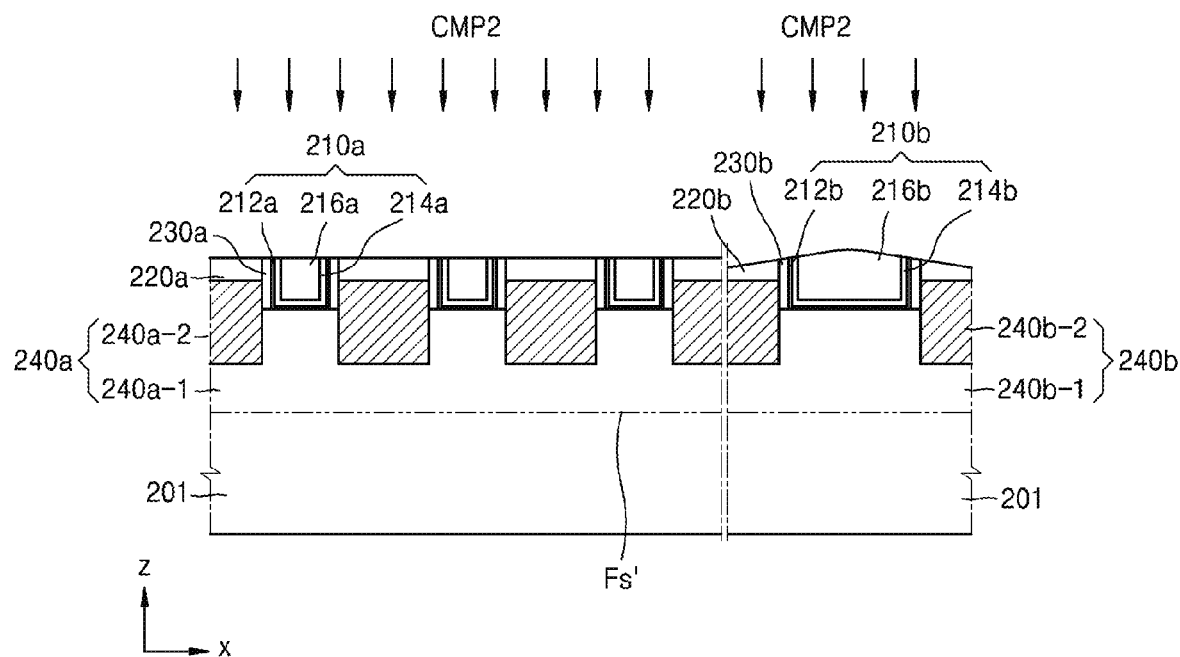
Figure 26G:
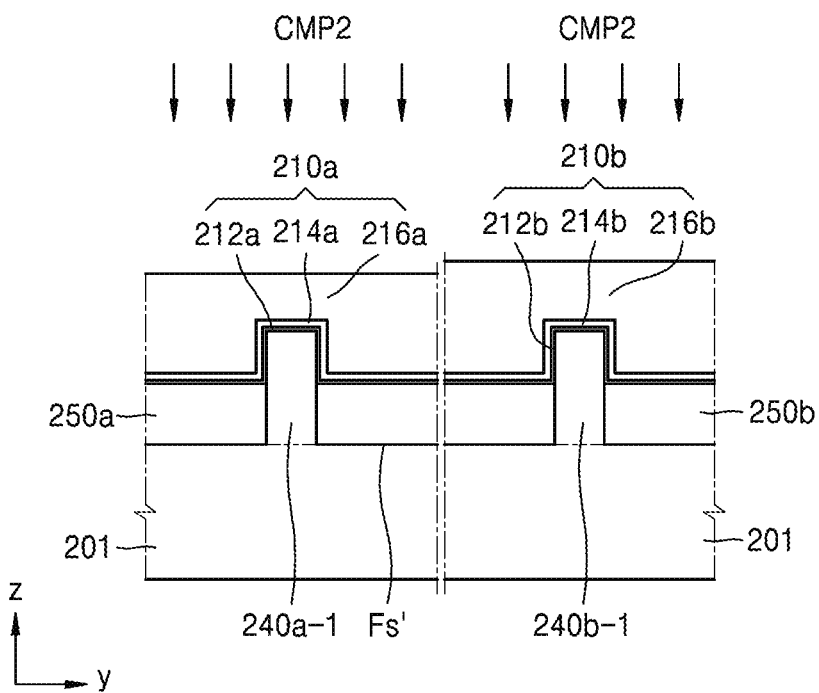

Referring to FIGS. 25G and 26G, after the first planarizing process, a second planarizing process may be performed. The second planarizing process may be performed through the second CMP CMP2. The second planarizing process may be performed until upper surfaces of the second interlayer insulating films 220a and 220b are exposed. The second planarizing process may be similar to the second planarizing process described with reference to FIG. 22F.

In more detail, not only the lower metal films 214a' and 214b' and the upper metal films 216a' and 216b' but also the insulating films 212a' and 212b' for the gate insulating film and the interlayer insulating films 220a and 220b may be etched during the second planarizing process. Accordingly, a polishing agent for commonly etching the lower metal films 214a' and 214b', the upper metal films 216a' and 216b', the insulating films 212a' and 212b' for the gate insulating film, and the interlayer insulating films 220a and 220b may be used during the second planarizing process.

Meanwhile, as described in the second planarizing process of FIG. 22F, after the second planarizing process, a construction of the gate structure 210a of the first region A may be different from that of the gate structure 210b of the second region B. That is, upper surfaces of the gate structures 210a and the interlayer insulating film 220a may have a same height and flat in the first region A. An upper surface of the gate structure 210b of the second region B may be the highest in a center portion and may be lower toward an edge portion, and an upper surface of the interlayer insulating film 220b in the second region B may be the highest in an edge portion adjacent to the gate structure 210b and may be lower toward a center portion.

While the inventive concepts have been particularly shown and described with reference to example embodiments thereof, it will be understood that various changes in form and details may be made therein without departing from the spirit and scope of the following claims. Accordingly, the true technical scope of the inventive concepts is defined by the technical spirit of the appended claims.

What is claimed is:

1. A semiconductor device comprising: a first fin and a second fin protruding from a semiconductor substrate, the fins respectively extending in a first direction;
   a first gate structure extending in a second direction perpendicular to the first direction on the first fin, the first gate structure having a substantially flat upper surface, and having a first width in the first direction, and including a first metal gate electrode; and
   a second gate structure on the second fin, the second gate structure having a second width greater than the first width in the first direction, and including a second metal gate electrode, wherein the second metal gate electrode has a center height in a vertical direction at a center portion that is greater than an edge height in the vertical direction at an edge portion.

2. The semiconductor device of claim 1, wherein the second metal gate electrode includes a second upper metal gate electrode and a second lower metal gate electrode, and the second upper metal gate electrode has a center height in the vertical direction at the center portion that is greater than an edge height in the vertical direction at the edge portion.

3. The semiconductor device of claim 1, wherein the first metal gate electrode includes a first upper metal gate electrode and a first lower metal gate electrode and the second metal gate electrode includes a second upper metal gate electrode and a second lower metal gate electrode, and
the first upper metal gate electrode and the second upper metal gate electrode comprise a same material.

4. The semiconductor device of claim 3, wherein the first lower metal gate electrode and the second lower metal gate electrode comprise a different material.

5. The semiconductor device of claim 1, wherein the first metal gate electrode has a maximum height in the vertical direction and the second metal gate electrode has a maximum height in the vertical direction, and the maximum height of the second metal gate electrode is greater than the maximum height of the first metal gate electrode.

6. The semiconductor device of claim 1, wherein the first metal gate electrode has a first height in a vertical direction at a center portion, the center height of the second metal gate electrode is greater than the first height.

7. The semiconductor device of claim 1, wherein the first metal gate electrode includes a first upper metal gate electrode and a first lower metal gate electrode and the second metal gate electrode includes a second upper metal gate electrode and a second lower metal gate electrode, and the first upper metal gate electrode has a second height in the vertical direction at the center portion of the first metal gate electrode and the second upper metal gate electrode has a third height in the vertical direction at the center portion of the second metal gate electrode, wherein the third height is greater than the second height.

8. The semiconductor device of claim 1, further comprising a gate oxide layer that is disposed on both opposite sidewalls and a bottom surface of the trench and the gate oxide layer comprises a high-k material.

9. The semiconductor device of claim 8, wherein the lower metal gate electrode is disposed on the gate oxide layer and on the both opposite sidewalls and the bottom surface of the trench.

10. The semiconductor device of claim 1, further comprising a third gate structure on a third fin, the third gate structure includes a third metal gate electrode having a third upper metal gate electrode and a third lower metal gate electrode, and the second metal gate electrode includes a second upper metal gate electrode and a second lower metal gate electrode, wherein the third lower metal gate electrode and the second lower metal gate electrode comprise a different material.

11. The semiconductor device of claim 1, further comprising a spacer surrounding side surfaces of the second gate structure.

12. The semiconductor device of claim 1, wherein the second width of the second gate structure is at least 80 nm and the first width of the first gate structure is less than 80 nm.

13. The semiconductor device of claim 1, wherein the second width of the second gate structure is greater by at least two times than the first width of the first gate structure.

14. A semiconductor device comprising:
a first fin and a second fin protruding from a semiconductor substrate, the fins respectively extending in a first direction;
a first gate structure extending in a second direction perpendicular to the first direction on the first fin, the first gate structure having a substantially flat upper surface, and having a first width in the first direction, and including a first metal gate electrode; and
a second gate structure on the second fin, the second gate structure having a second width greater than the first width in the first direction, and including a second metal gate electrode,
wherein an upper surface of the second metal gate electrode comprises a first surface and a second surface, the first surface inclines with a first angle with respect to a first sidewall of the second metal gate electrode and the second surface inclines with a second angle with respect to a second sidewall of the second metal gate electrode, the first angle and the second angle are respectively less than 90 degree.

15. The semiconductor device of claim 14, wherein the second metal gate electrode has a center height in a vertical direction at a center portion that is greater than an edge height in the vertical direction at an edge portion.

16. The semiconductor device of claim 14, wherein the first metal gate electrode has a maximum height in a vertical direction and the second metal gate electrode has a maximum height in the vertical direction that is greater than the maximum height of the first metal gate electrode.

17. The semiconductor device of claim 14, wherein an upper surface of the second metal gate electrode is convex.

18. The semiconductor device of claim 14, wherein the first metal gate electrode includes a first upper metal gate electrode and a first lower metal gate electrode and the second metal gate electrode includes a second upper metal gate electrode and a second lower metal gate electrode, and the first upper metal gate electrode and the second upper metal gate electrode comprise a same material.

19. The semiconductor device of claim 18, wherein the first lower metal gate electrode and the second lower metal gate electrode comprise a different material.

20. The semiconductor device of claim 14, further comprising a spacer surrounding side surfaces of the second gate structure.

21. The semiconductor device of claim 14, wherein the second width of the second gate structure is at least 80 nm and the first width of the first gate structure is less than 80 nm.

22. The semiconductor device of claim 14, wherein the second width of the second gate structure is greater by at least two times than the first width of the first gate structure.

23. A semiconductor device comprising:
a first fin and a second fin protruding from a semiconductor substrate, the fins respectively extending in a first direction;
a first gate structure extending in a second direction perpendicular to the first direction on the first fin, the first gate structure having a substantially flat upper surface, and having a first width in the first direction, and including a first metal gate electrode; and a second gate structure on the second fin, the second gate structure having a second width greater than the first width in the first direction, and including a second metal gate electrode, wherein the first metal gate electrode has a maximum height in a vertical direction and the second metal gate electrode has a maximum height in the vertical direction that is greater than the maximum height of the first metal gate electrode.

24. The semiconductor device of claim 23, wherein an upper surface of the second metal gate electrode is convex.

25. The semiconductor device of claim 23, wherein the first metal gate electrode includes a first upper metal gate electrode and a first lower metal gate electrode and the second metal gate electrode includes a second upper metal gate electrode and a second lower metal gate electrode, and the first upper metal gate electrode and the second upper metal gate electrode comprise a same material.

26. The semiconductor device of claim 25, wherein the first lower metal gate electrode and the second lower metal gate electrode comprise a different material.

27. The semiconductor device of claim 23, further comprising a spacer surrounding side surfaces of the second gate structure.

28. The semiconductor device of claim 23, wherein the second width of the second gate structure is at least 80 nm and the first width of the first gate structure is less than 80 nm.

29. The semiconductor device of claim 23, wherein the second width of the second gate structure is greater by at least two times than the first width of the first gate structure.

30. A semiconductor device comprising:
a first fin and a second fin protruding from a semiconductor substrate, the fins respectively extending in a first direction;
a first gate structure extending in a second direction perpendicular to the first direction on the first fin, the first gate structure having a substantially flat upper surface, and having a first width in the first direction, and including a first metal gate electrode; and
a second gate structure on the second fin, the second gate structure having a second width greater than the first width in the second direction, and including a second metal gate electrode, wherein an upper surface of the second metal gate electrode is convex.

31. The semiconductor device of claim 30, wherein the first metal gate electrode includes a first upper metal gate electrode and a first lower metal gate electrode and the second metal gate electrode includes a second upper metal gate electrode and a second lower metal gate electrode, and the first upper metal gate electrode and the second upper metal gate electrode comprise a same material.

32. The semiconductor device of claim 31, wherein the first lower metal gate electrode and the second lower metal gate electrode comprise a different material.

33. The semiconductor device of claim 30, further comprising a spacer surrounding side surfaces of the second gate structure.

34. The semiconductor device of claim 30, wherein the second width of the second gate structure is at least 80 nm and the first width of the first gate structure is less than 80 nm.

35. The semiconductor device of claim 30, wherein the second width of the second gate structure is greater by at least two times than the first width of the first gate structure.

* * * * *